US010742357B2

(12) United States Patent
Zhang et al.

(10) Patent No.: US 10,742,357 B2
(45) Date of Patent: *Aug. 11, 2020

(54) PHYSICAL LAYER FRAME FORMAT FOR WLAN

(71) Applicant: Marvell World Trade Ltd., St. Michael (BB)

(72) Inventors: Hongyuan Zhang, Fremont, CA (US); Sudhir Srinivasa, Campbell, CA (US); Rohit U. Nabar, Sunnyvale, CA (US); Raja Banerjea, Sunnyvale, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

This patent is subject to a terminal disclaimer.

(21) Appl. No.: 16/195,528

(22) Filed: Nov. 19, 2018

(65) Prior Publication Data

US 2019/0089482 A1 Mar. 21, 2019

Related U.S. Application Data

(60) Continuation of application No. 14/846,280, filed on Sep. 4, 2015, now Pat. No. 10,135,572, which is a
(Continued)

(51) Int. Cl.
*H04W 56/00* (2009.01)
*H04L 1/00* (2006.01)
(Continued)

(52) U.S. Cl.
CPC .......... *H04L 1/009* (2013.01); *H03M 13/098* (2013.01); *H03M 13/655* (2013.01);
(Continued)

(58) Field of Classification Search
CPC ..... H04L 1/009; H04L 1/0041; H04L 1/0061; H04L 1/0072; H04L 1/0079;
(Continued)

(56) References Cited

U.S. PATENT DOCUMENTS 5,878,057 A 3/1999 Maa
6,167,515 A 12/2000 Lin
(Continued)

FOREIGN PATENT DOCUMENTS

JP 2005-304063 A 10/2005
JP 2013-543672 A 12/2013
(Continued)

OTHER PUBLICATIONS

"IEEE P802.11 n™/D3.00, Draft Standard for Information Technology—Telecommunications and information exchange between systems—Local and metropolitan area networks—Specific requirements, Part 11: Wireless LAN Medium Access Control (MAC) and Physical Layer (PHY) specifications: Amendment 4: Enhancements for Higher Throughput," *The Institute of Electrical and Electronics Engineers, Inc.*, Sep. 2007.
(Continued)

*Primary Examiner* — Sai Ming Chan

(57) ABSTRACT

In a method for generating a data unit conforming to a first communication protocol, a first field and a second field to be included in a preamble of the data unit are generated. The first field includes a first set of one or more information bits that indicate a duration of the data unit and is formatted such that the first field allows a receiver device that conforms to a second communication protocol to determine the duration of the data unit. The second field includes a second set of one or more information bits that indicate to a receiver device that conforms to the first communication protocol that the data unit conforms to the first communication protocol. The first field and the second field are modulated using a modulation scheme specified for a field corresponding to the first field and the second field, respectively, by the second communication protocol.

24 Claims, 16 Drawing Sheets

Related U.S. Application Data division of application No. 13/856,277, filed on Apr. 3, 2013, now Pat. No. 9,131,528.

(60) Provisional application No. 61/619,640, filed on Apr. 3, 2012.

(51) Int. Cl.
  *H04W 84/02* (2009.01)
  *H03M 13/09* (2006.01)
  *H03M 13/00* (2006.01)
  *H04L 5/00* (2006.01)

(52) U.S. Cl.
  CPC .......... *H04L 1/0041* (2013.01); *H04L 1/0061* (2013.01); *H04L 1/0072* (2013.01); *H04L 1/0079* (2013.01); *H04L 5/0007* (2013.01); *H04W 84/02* (2013.01)

(58) Field of Classification Search
  CPC . H04L 5/0007; H03M 13/098; H03M 13/655; H04W 84/02
  USPC .......................................................... 370/466
  See application file for complete search history.

(56) References Cited

U.S. PATENT DOCUMENTS

| | | | |
|---|---|---|---|
| 6,192,498 B1 | 2/2001 | Arato | |
| 6,226,771 B1 | 5/2001 | Hilla et al. | |
| 6,427,219 B1 | 7/2002 | Yang | |
| 6,704,364 B1 | 3/2004 | Lim et al. | |
| 6,888,844 B2 | 5/2005 | Mallory et al. | |
| 6,891,881 B2 | 5/2005 | Trachewsky et al. | |
| 6,910,172 B2 | 6/2005 | Hara et al. | |
| 6,934,902 B2 | 8/2005 | Hara et al. | |
| 7,080,348 B2 | 7/2006 | Savage | |
| 7,203,885 B2 | 4/2007 | Gibart | |
| 7,257,758 B1 | 8/2007 | Manula et al. | |
| 7,336,667 B2 | 2/2008 | Allen, Jr. et al. | |
| 7,388,853 B2 | 6/2008 | Ptasinski et al. | |
| 7,406,106 B2 | 7/2008 | Mallory | |
| 7,453,285 B2 | 11/2008 | Kiel et al. | |
| 7,478,314 B1 | 1/2009 | Cheong et al. | |
| 7,599,332 B2 | 10/2009 | Zelst et al. | |
| 7,626,576 B2 | 12/2009 | Anandakumar et al. | |
| 7,742,390 B2 | 6/2010 | Mujtaba | |
| 7,760,700 B2 | 7/2010 | Frederiks et al. | |
| 7,822,005 B2 | 10/2010 | Ptasinski et al. | |
| 7,904,519 B2 | 3/2011 | Czotscher et al. | |
| 7,920,599 B1 | 4/2011 | Subramanian et al. | |
| 7,974,225 B2 | 7/2011 | Kasher | |
| 7,987,405 B2 | 7/2011 | Turner et al. | |
| 8,010,865 B2 | 8/2011 | Gu et al. | |
| 8,046,663 B2 | 10/2011 | Yoon | |
| 8,111,704 B2 | 2/2012 | Singhal et al. | |
| 8,144,647 B2 | 3/2012 | Nabar et al. | |
| 8,155,138 B2 | 4/2012 | van Nee | |
| 8,179,897 B2 | 5/2012 | Allen, Jr. et al. | |
| 8,201,065 B1 | 6/2012 | Cheong et al. | |
| 8,213,484 B2 | 7/2012 | Walton et al. | |
| 8,218,554 B2 | 7/2012 | Allen, Jr. et al. | |
| 8,223,072 B2 | 7/2012 | Ponnuswamy | |
| 8,225,187 B1 | 7/2012 | Schultz et al. | |
| 8,234,551 B2 | 7/2012 | Shen et al. | |
| 8,245,108 B2 | 8/2012 | Yoon | |
| 8,264,977 B2 | 9/2012 | Sanguineti et al. | |
| 8,289,869 B2 | 10/2012 | Sawai | |
| 8,332,719 B2 | 12/2012 | You et al. | |
| 8,339,978 B2 | 12/2012 | Sawai et al. | |
| 8,418,024 B2 | 4/2013 | You et al. | |
| 8,509,051 B2 | 8/2013 | Ling et al. | |
| 8,526,351 B2 | 9/2013 | Fischer et al. | |
| 8,543,884 B2 | 9/2013 | Mansour | |
| 8,572,289 B1 | 10/2013 | Johnson | |
| 8,599,804 B2 | 12/2013 | Erceg et al. | |
| 8,619,907 B2 | 12/2013 | Mujtaba et al. | |
| 8,627,171 B2 | 1/2014 | Pi | |
| 8,681,757 B2 | 3/2014 | Lee et al. | |
| 8,867,653 B2 | 10/2014 | Zhang et al. | |
| 8,948,283 B2 | 2/2015 | Zhang | |
| 9,118,442 B2 | 8/2015 | Chang et al. | |
| 9,131,528 B2 | 9/2015 | Zhang et al. | |
| 9,184,794 B1 | 11/2015 | Ibrahim et al. | |
| 9,184,967 B1 | 11/2015 | Ibrahim et al. | |
| 9,209,837 B1 | 12/2015 | Cheong et al. | |
| 9,232,435 B2 | 1/2016 | Schliwa-Bertling et al. | |
| 9,258,829 B1 | 2/2016 | Ibrahim et al. | |
| 9,294,164 B2 | 3/2016 | Zhang et al. | |
| 9,397,785 B1 | 7/2016 | Zhang et al. | |
| 9,414,432 B2 | 8/2016 | Zhang | |
| 9,819,771 B1 | 11/2017 | Zhang et al. | |
| 9,876,662 B2 | 1/2018 | Lee et al. | |
| 10,135,572 B2 | 11/2018 | Zhang et al. | |
| 10,142,149 B2 | 11/2018 | Lee et al. | |
| 2003/0031151 A1 | 2/2003 | Sharma et al. | |
| 2003/0056043 A1 | 3/2003 | Kostadinov | |
| 2003/0142626 A1 | 7/2003 | Umayabashi et al. | |
| 2005/0169261 A1 | 8/2005 | Williams et al. | |
| 2006/0182017 A1 | 8/2006 | Hansen et al. | |
| 2007/0014375 A1 | 1/2007 | Nakao | |
| 2007/0047666 A1 | 3/2007 | Trachewsky | |
| 2007/0153830 A1 | 7/2007 | Xhafa et al. | |
| 2008/0299962 A1 | 12/2008 | Kasher | |
| 2009/0103485 A1 | 4/2009 | Singh et al. | |
| 2009/0196163 A1 | 8/2009 | Du | |
| 2010/0046358 A1 | 2/2010 | van Nee | |
| 2010/0046542 A1 | 2/2010 | van Zelst et al. | |
| 2010/0046656 A1* | 2/2010 | van Nee | C08F 214/18 375/267 |
| 2010/0074277 A1 | 3/2010 | Nishibayashi et al. | |
| 2010/0091673 A1 | 4/2010 | Sawai et al. | |
| 2010/0260159 A1* | 10/2010 | Zhang | H04L 27/2613 370/338 |
| 2010/0309834 A1 | 12/2010 | Fischer et al. | |
| 2010/0309848 A1 | 12/2010 | Erceg et al. | |
| 2010/0310002 A1 | 12/2010 | Lauer et al. | |
| 2011/0002219 A1 | 1/2011 | Kim et al. | |
| 2011/0032875 A1 | 2/2011 | Erceg et al. | |
| 2011/0110348 A1 | 5/2011 | Lee et al. | |
| 2011/0149927 A1 | 6/2011 | Stacey et al. | |
| 2011/0194475 A1 | 8/2011 | Kim et al. | |
| 2011/0194655 A1 | 8/2011 | Sampath et al. | |
| 2011/0222490 A1 | 9/2011 | Fischer et al. | |
| 2011/0255620 A1 | 10/2011 | Jones, IV et al. | |
| 2011/0271169 A1 | 11/2011 | Pi | |
| 2011/0280182 A1 | 11/2011 | Kim et al. | |
| 2012/0155447 A1 | 6/2012 | Vermani et al. | |
| 2012/0195391 A1 | 8/2012 | Zhang et al. | |
| 2012/0201316 A1 | 8/2012 | Zhang et al. | |
| 2012/0294294 A1 | 11/2012 | Zhang | |
| 2012/0300874 A1 | 11/2012 | Zhang | |
| 2012/0327871 A1 | 12/2012 | Ghosh et al. | |
| 2013/0202001 A1 | 8/2013 | Zhang | |
| 2013/0259017 A1 | 10/2013 | Zhang et al. | |
| 2014/0064194 A1 | 3/2014 | Schliwa-Bertling et al. | |
| 2014/0337690 A1 | 11/2014 | Zhang | |
| 2015/0207521 A1 | 7/2015 | Waters | |

FOREIGN PATENT DOCUMENTS

| | | |
|---|---|---|
| JP | 2013-543677 A | 12/2013 |
| WO | WO-2010/120692 | 10/2010 |
| WO | WO-2011/087560 A2 | 7/2011 |
| WO | WO-2012/039640 | 3/2012 |
| WO | WO-2012/040396 | 3/2012 |
| WO | WO 2012/0122119 | 9/2012 |
| WO | WO-2013/152111 | 10/2013 |
| WO | WO-2014/183059 | 11/2014 |

OTHER PUBLICATIONS

Chen, "Home Network Basis: Transmission Environments and Wired/Wireless Protocols," Prentice Hall, pp. 1-26 (Jul. 2006).

(56) References Cited

OTHER PUBLICATIONS

Communication pursuant to Article 94(3) EPC in European Patent Application No. 13718247.3-1901, dated Sep. 13, 2017 (5 pages).
EE Std 802.11g/D8.2, Apr. 2003 (Supplement to ANSI/IEEE Std 802.11, 1999 (Reaff 2003)) "Draft Supplement to Standard [for] Information technology—Telecommunications and information exchange between systems—Local and metropolitan area networks—Specific requirements, Part 11: Wireless LAN Medium Access Control (MAC) and Physical Layer (PHY) specifications: Further Higher Data Rate Extension in the 2.4 GHz Band," *The Institute of Electrical and Electronics Engineers, Inc.*, pp. 1-69 (Apr. 2003).
Gunnam et al., "Multi-Rate Layered Decoder Architecture for Block LDPC Codes of the IEEE 802.11 n Wireless Standard," IEEE International Symposium on Circuits and Systems, 2007 (ISCAS 2007), pp. 1645-1648 (2007).
Hiertz et al., "The IEEE 802.11 Universe," IEEE Communications Magazine, pp. 62-70, (Jan. 2010).
IEEE Std 802.11a-1999 (R2003) (Supplement to IEEE Std 802.11-1999) "Supplement to IEEE Standard for Information technology—Telecommunications and information exchange between systems—Local and metropolitan area networks—Specific requirements—Part 11: Wireless LAN Medium Access Control (MAC) and Physical Layer (PHY) specifications: High-Speed Physical Layer in the 5 Ghz Band," *The Institute of Electrical and Electronics Engineers, Inc.*, (1999) Reaffirmed Jun. 12, 2003.
IEEE Std 802.11a-1999 (Supplement to IEEE Std 802.11-1999) "Supplement to IEEE Standard for Information technology—Telecommunications and information exchange between systems—Local and metropolitan area networks—Specific requirements—Part 11: Wireless LAN Medium Access Control (MAC) and Physical Layer (PHY) specifications: High-Speed Physical Layer in the 5 Ghz Band," *The Institute of Electrical and Electronics Engineers, Inc.*, pp. 1-83 (Sep. 1999).
IEEE Std 802.11ac/D2.0 "Draft Standard for Information Technology—Telecommunications and information exchange between systems—Local and metropolitan area networks—Specific requirements, Part 11: Wireless LAN Medium Access Control (MAC) and Physical Layer (PHY) specifications: Amendment 4: Enhancements for Very High Throughput for Operation in Bands below 6 GHz," The Institute of Electrical and Electronics Engineers, Inc., Jan. 2012.
IEEE Std 802.11ac/D2.1 "Draft Standard for Information Technology—Telecommunications and information exchange between systems—Local and metropolitan area networks—Specific requirements, Part 11: Wireless LAN Medium Access Control (MAC) and Physical Layer (PHY) specifications: Amendment 4: Enhancements for Very High Throughput for Operation in Bands below 6 GHz," The Institute of Electrical and Electronics Engineers, Inc., Mar. 2012.
IEEE Std 802.11af/D1.05 "Draft Standard for Information Technology—Telecommunications and information exchange between systems—Local and metropolitan area networks—Specific requirements, Part 11: Wireless LAN Medium Access Control (MAC) and Physical Layer (PHY) specifications: Amendment 4: TV White Spaces Operation," *The Institute of Electrical and Electronics Engineers, Inc.*, pp. 1-123 (Nov. 2011).
IEEE Std 802.11b-1999/Cor Jan. 2001 (Corrigendum to IEEE Std 802.11b-1999) "IEEE Standard for Information technology—Telecommunications and information exchange between systems—Local and metropolitan area networks—Specific requirements, Part 11: Wireless LAN Medium Access Control (MAC) and Physical Layer (PHY) specifications, Amendment 2: Higher-speed Physical Layer (PHY) extension in the 2.4 GHz band-Corrigendum 1," The Institute of Electrical and Electronics Engineers, Inc., Nov. 7, 2001.
IEEE Std 802.11™ 2012 (Revision of IEEE Std 802.11-2007) IEEE Standard for Information technology—Telecommunications and information exchange between systems—Local and metropolitan area networks—Specific requirements Part 11: Wireless LAN Medium Access Control (MAC) and Physical Layer (PHY) specifications, *The Institute of Electrical and Electronics Engineers, Inc.*, pp. 1-2695 (Mar. 29, 2012).

IEEE Std. 802.11n.sup.IM "IEEE Standard for Information Technology—Telecommunications and information exchange between systems—Local and metropolitan area networks—Specific requirements, Part 11: Wireless LAN Medium Access Control (MAC) and Physical Layer (PHY) Specifications: Amendment 5: Enhancements for Higher Throughput," The Institute of Electrical and Electronics Engineers, Inc., pp. 1-535 (Oct. 2009).
Imashioya et al., "RTL Design of 1.2 Gbps MIMO WLAN System and Its Business Aspect," IEEE 9th Int'l Symposium on Communications and Information Technology (ISCIT 2009), *The Institute of Electrical and Electronics Engineers*, pp. 296-301 (2009).
International Preliminary Report on Patentability in International Application No. PCT/US2014/037534, dated Nov. 19, 2015 (15 pages).
International Search Report and Written Opinion in International Application No. PCT/US2014/037534, dated Oct. 21, 2014 (21 pages).
International Search Report issued in International Application No. PCT/US2013/035132, dated Jun. 24, 2013.
International Standard, ISO/IEC 8802-11, ANSI/IEEE Std 802.11, "Information technology—Telecommunications and information exchange between systems—local and metropolitan area networks—specific requirements" Part 11: Wireless LAN Medium Access Control (MAC) and Physical Layer (PHY) specifications, The Institute of Electrical and Electronics Engineers, Inc., (1999).
Invitation to Pay Additional Fees and Partial International Search Report for PCT Application No. PCT/US2014/037534, 9 pages (dated Aug. 21, 2014).
Mujtaba, "IEEE P802.11—Wireless LANs, TGn Sync Proposal Technical Specification," *The Institute of Electrical and Electronics Engineers, Inc.*, doc.: IEEE 802.11-04/0889r6, pp. 1-131 (May 2005).
Office Action in Chinese Patent Application No. 201380018704.5, dated Feb. 23, 2017, with English translation (11 pages).
Office Action in Chinese Patent Application No. 201380018704.5, dated Mar. 5, 2018, with English translation (5 pages).
Office Action in Japanese Patent Application No. 2015-504708, dated Feb. 14, 2017, with English translation (10 pages).
Park, "Specification Framework for TGah," *The Institute of Electrical and Electronics Engineers*, doc. No. IEEE 802.11-11/1137r13, pp. 1-58 (Jan. 14, 2013).
Second Office Action in Chinese Patent Application No. 2013800187045, dated Sep. 13, 2017, with English translation (6 pages).
Shao, "Channel Selection for 802.11ah," doc.: IEEE 802.11-12/0816r0, pp. 1-11 (Jul. 2012).
Shi et al., "Phase Tracking During VHT-LTF," Doc. No. IEEE 802.11-10/0771r0, *The Institute of Electrical and Electronics Engineers, Inc.*, pp. 1-19 (Jul. 2010).
Syafei et al., "A Design of Next Generation Gigabit MIMO Wireless LAN System ," IEEE 12th Int'l Conference on Advanced Communication Technology (ICACT 2010), *The Institute of Electrical and Electronics Engineers*, pp. 941-946 (2010).
Syafei et al., "A Gigabit MIMO WLAN System with International Standardization Strategy," IEEE Int'l Symposium on Intelligent Signal Processing and Communication Systems (ISPACS 2009), *The Institute of Electrical and Electronics Engineers*, pp. 228-231 (2009).
Syafei et al., "Design of 1.2 Gbps MIMO WLAN System for 4K Digital Cinema Transmission," IEEE 20th Int'l Symposium on Personal, Indoor and Mobile Radio Communications (PIMRC 2009), *The Institute of Electrical and Electronics Engineers*, pp. 207-211 (2009).
Van Zelst et al., "Pilot Sequence for VHT-DATA," Doc. No. IEEE 802.11-10/0811r1, *The Institute of Electrical and Electronics Engineers, Inc.*, pp. 1-10 (Jul. 2010).
Vermani et al. "Preamble Format for 1 MHz," *The Institute of Electrical and Electronics Engineers*, doc. No. IEEE 802.11-11/1482r2, pp. 1-30 (Nov. 2011).
Vermani, et al. "Spec Framework Text for PHY Numerology," *The Institute of Electrical and Electronics Engineers*, doc. No. IEEE 802.11-11/1311r0, pp. 1-5 (Sep. 2011).

(56) References Cited

OTHER PUBLICATIONS

Written Opinion issued in International Application No. PCT/US2013/035132, dated Jun. 24, 2013.
Yu et al., "Coverage extension for IEEE802.11ah," *The Institute of Electrical and Electronics Engineers*, doc. No. IEEE 802.11-11/0035r1, pp. 1-10 (Jan. 2011).
Zhang et al., "11ah Data Transmission Flow," *The Institute of Electrical and Electronics Engineers*, doc. No. IEEE 802.11-11/1484r1, pp. 1-15 (Nov. 2011).
Zhang et al., "Beamforming Feedback for Single Stream," *The Institute of Electrical and Electronics Engineers*, doc. No. IEEE 802.11-12/1312r0, pp. 1-22 (Nov. 12, 2012).
De Vegt, "Potential Compromise for 802.11ah Use Case Document," Institute of Electrical and Electronics Engineers, doc. No. IEEE 802.11-11/0457, pp. 1-27 (Mar. 2011).
Francis, "Viterbi Decoder Block Decoding—Trellis Termination and Tail Biting," Xilinx XAPP551 v2.0, pp. 1-21 (Jul. 30, 2010).
Perahia et al., "Gigabit Wireless LANs: an overview of IEEE 802.11ac and 80211ad," ACM SIGMOBILE Mobile Computing and Communications Review, vol. 15, No. 3, pp. 23-33 (Jul. 2011).
Stacey et al., "IEEE P802.11, Wireless LANs, Proposed TGac Draft Amendment," Institute of Electrical and Electronics Engineers, doc. No. IEEE 802.11-10/1361r3 pp. 1-154 (Jan. 2011).
Stacey et al., "Specification Framework for TGac," document No. IEEE 802.11-09/0992r20, Institute for Electrical and Electronics Engineers, pp. 1-49, (Jan. 18, 2011).
Taghavi et al., "Introductory Submission for TGah," doc. No. IEEE 802.11-11/0062r0, *Institute for Electrical and Electronics Engineers*, pp. 1-5 (Jan. 14, 2011).
Van Nee, et al. "The 802.11 n MIMO-OFDM Standard for Wireless LAN and Beyond," Wireless Personal Communications, vol. 37, pp. 445-453 (Jun. 2006).
Zhang et al., "1 MHz Waveform in Wider BW", The Institute of Electrical and Electronics Engineers, doc. No. IEEE 802.11-12/0309r1, pp. 1-10 (Mar. 2012).
Communication pursuant to Article 94(3) EPC in European Patent Application No. 13718247.3, dated Oct. 23, 2019 (4 pages).
Office Action in Korean Patent Application No. 10-2014-7030662, dated Nov. 29, 2019, with English translation (8 pages).

\* cited by examiner

PHYSICAL LAYER FRAME FORMAT FOR WLAN

CROSS-REFERENCES TO RELATED APPLICATIONS

This application is a continuation of U.S. application Ser. No. 14/846,280, filed Sep. 4, 2015, entitled "Physical Layer Frame Format for WLAN," now U.S. Pat. No. 10,135,572, which is a divisional of U.S. application Ser. No. 13/856,277, filed Apr. 3, 2013, entitled "Physical Layer Frame Format for WLAN," now U.S. Pat. No. 9,131,528, which claims the benefit of U.S. Provisional Patent Application No. 61/619,640, filed Apr. 3, 2012, entitled "Preamble Design for "post-11ac" WLAN at 5 GHz." All of the applications referenced above are incorporated herein by reference in their entireties.

FIELD OF THE DISCLOSURE

The present disclosure relates generally to communication networks and, more particularly, to wireless local area networks that utilize orthogonal frequency division multiplexing (OFDM).

BACKGROUND

When operating in an infrastructure mode, wireless local area networks (WLANs) typically include an access point (AP) and one or more client stations. WLANs have evolved rapidly over the past decade. Development of WLAN standards such as the Institute for Electrical and Electronics Engineers (IEEE) 802.11a, 802.11b, 802.11g, and 802.11n Standards has improved single-user peak data throughput. For example, the IEEE 802.11b Standard specifies a single-user peak throughput of 11 megabits per second (Mbps), the IEEE 802.11a and 802.11g Standards specify a single-user peak throughput of 54 Mbps, the IEEE 802.11n Standard specifies a single-user peak throughput of 600 Mbps, and the IEEE 802.11ac Standard specifies a single-user peak throughput in the gigabits per second (Gbps) range. Future standards promise to provide even greater throughputs, such as throughputs in the tens of Gbps range.

SUMMARY

In an embodiment, a method for generating a data unit for transmission via a communication channel, the data unit conforming to a first communication protocol, includes: generating, at a network interface device, a first field to be included in a preamble of the data unit, wherein the first field includes a first set of one or more information bits that indicate a duration of the data unit, the first field being formatted such that the first field is decodable by a receiver device that conforms to a second communication protocol, but does not conform to the first communication protocol, to determine the duration of the data unit based on the first field; generating, at the network interface device, a second field to be included in the preamble, wherein the second field includes a second set of one or more information bits that indicate to a receiver device that conforms to the first communication protocol that the data unit conforms to the first communication protocol, and wherein generating the second field includes one or both of (i) generating the second set of one or more information bits according to an error detection scheme not specified by the second communication protocol and (ii) generating the second set of one or more information bits to indicate a mode not supported by the second communication protocol; modulating, at the network interface device, the first field using a modulation scheme specified for a field corresponding to the first field by the second communication protocol; modulating, at the network interface device, the second field using a modulation scheme specified for a field corresponding to the second field by the second communication protocol; generating, at the network interface device, the preamble to include at least the first field and the second field; and generating, at the network interface device, the data unit to include at least the preamble.

In other embodiments, the method includes any combination of one or more of the following elements.

Generating the second set of one or more information bits according to the error detection scheme not specified by the second communication protocol comprises generating a cyclic redundancy check (CRC) for the second field according to a CRC polynomial different than a CRC polynomial specified for the corresponding field by the second communication protocol.

Generating the second set of one or more information bits according to the error detection scheme not specified by the second communication protocol comprises generating a cyclic redundancy check (CRC) for the second field, including: generating, at the network interface device, a plurality of CRC bits according to a CRC polynomial specified for the corresponding field by the second communication protocol, and encrypting, at the network interface device, one or more bits of the plurality of CRC bits to generate the CRC for the second field.

Generating the second set of one or more information bits according to the error detection scheme not specified by the second communication protocol comprises generating a cyclic redundancy check (CRC) for the second field, including generating a plurality of CRC bits according to a CRC polynomial specified for the corresponding field by the second communication protocol, selecting a subset of the plurality of CRC bits, the subset to be utilized for the CRC for the second field; and encrypting one or more bits in the selected subset of the plurality of CRC bits to generate the CRC for the second field.

The second field includes a modulation and coding (MCS) subfield, and wherein generating the second set of one or more information bits to indicate the mode not supported by the second communication protocol includes generating the MCS subfield to indicate a modulation and coding scheme not supported by the second communication protocol.

The second field further includes an indication that the data unit conforms to the first communication protocol.

The second communication protocol conforms to the Institute for Electrical and Electronics Engineers (IEEE) 802.11ac Standard.

The first communication protocol is a communication protocol that supports a higher throughput than the IEEE 802.11ac Standard.

In another embodiment, an apparatus comprises a network interface having one or more integrated circuits configured to: generate a first field to be included in a preamble of the data unit, wherein the first field includes a first set of one or more information bits that indicate a duration of the data unit, the first field being formatted such that the first field is decodable by a receiver device that conforms to a second communication protocol, but does not conform to the first communication protocol, to determine the duration of the data unit based on the first field, generate a second field to be included in the preamble, wherein the second field includes a second set of one or more information bits that indicate to a receiver device that conforms to the first communication protocol that the data unit conforms to the first communication protocol, and wherein generating the second field includes one or both of (i) generating the second set of one or more information bits according to an error detection scheme not specified by the second communication protocol and (ii) generating the second set of one or more information bits to indicate a mode not supported by the second communication protocol, modulate the first field using a modulation scheme specified for a field corresponding to the first field by the second communication protocol, modulate the second field using a modulation scheme specified for a field corresponding to the second field by the second communication protocol, generate the preamble to include at least the first field and the second field, and generate the data unit to include at least the preamble.

In other embodiments, the apparatus includes any combination of one or more of the following features.

The one or more integrated circuits are configured to generate the second set of one or more information bits according to the error detection scheme not specified by the second communication protocol at least by generating a cyclic redundancy check (CRC) for the second field according to a CRC polynomial different than a CRC polynomial specified for the corresponding field by the second communication protocol.

The one or more integrated circuits are configured to generate the second set of one or more information bits according to the error detection scheme not specified by the second communication protocol at least by generating a cyclic redundancy check (CRC) for the second field, including generating a plurality of CRC bits according to a CRC polynomial specified for the corresponding field by the second communication protocol, and encrypting one or more bits of the plurality of CRC bits to generate the CRC for the second field.

The one or more integrated circuits are configured to generate the second set of one or more information bits according to the error detection scheme not specified by the second communication protocol at least by generating a cyclic redundancy check (CRC) for the second field, including generating a plurality of CRC bits according to a CRC polynomial specified for the corresponding field in the second communication protocol, selecting a subset of the plurality of CRC, the subset to be utilized for the CRC for the second field; and encrypting one or more bits in the selected subset of the plurality of CRC bits to generate the CRC for the second field.

The second field includes a modulation and coding (MCS) subfield.

The one or more integrated circuits are configured to generate the second set of one or more information bits to indicate the mode not supported by the second communication protocol at least by generating the MCS subfield to indicate a modulation and coding scheme not supported by the second communication protocol.

The one or more integrated circuits are further configured to include, in the second field, an indication that the data unit conforms to the first communication protocol.

The second communication protocol conforms to the Institute for Electrical and Electronics Engineers (IEEE) 802.11ac Standard.

The first communication protocol is a communication protocol that supports a higher throughput than the IEEE 802.11ac Standard.

In yet another embodiment, a method includes receiving a data unit, wherein the data unit conforms to a first communication protocol or to a second communication protocol, and decoding a field of a preamble of the data unit, including decoding a received cyclic redundancy check (CRC) included in the field. The method also includes generating, based on the field, a first CRC using a first CRC generation scheme, the first CRC generation scheme specified for the first field by the first communication protocol. The method further includes generating, based on the field, a second CRC using a second CRC generation scheme, the second CRC generation scheme specified for the field by the second communication protocol. The method further still includes comparing (i) the first generated CRC and (ii) the second generated CRC to the received CRC. The method additionally includes determining that the data unit conforms to the first communication protocol when the first generated CRC matches the received CRC, and determining that the data unit conforms to the second communication protocol when the second generated CRC matches the received CRC.

In other embodiments, the method includes any combination of one or more of the following elements.

Generating the first CRC comprises generating the first CRC according to a first CRC polynomial, the first CRC polynomial specified for the field by the first communication protocol.

Generating the second CRC comprises generating the second CRC according to a second CRC polynomial, the second CRC polynomial specified for the field by the second communication protocol, wherein the second CRC polynomial is different than the first CRC polynomial.

Generating the first CRC comprises generating the first CRC according to a first CRC polynomial, the first CRC polynomial specified for the field by the first communication protocol.

Generating the second CRC comprises generating a plurality of CRC bits according to the first CRC polynomial, and encrypting one or more bits of the plurality of CRC bits to generate the second CRC.

Generating the second CRC comprises generating a plurality of CRC bits according to the first CRC polynomial, selecting a subset of the plurality of CRC bits, the subset to be utilized for the CRC for the second CRC; and encrypting one or more bits in the selected subset of the plurality of CRC bits to generate the second CRC.

In still another embodiment, an apparatus comprises a network interface having one or more integrate circuits configured to receive a data unit, wherein the data unit conforms to a first communication protocol or a second communication protocol, and decode a field of a preamble of the data unit, including decoding a received cyclic redundancy check (CRC) included in the field. The network interface is also configured to generate, based on the field, a first CRC using a first CRC generation scheme, the first CRC generation scheme specified for the first field by the first communication protocol, and generate, based on the field, a second CRC using a second CRC generation scheme, the second CRC generation scheme specified for the field by the second communication protocol. The network interface is further configured to compare the first generated CRC and the second generated CRC to the received CRC. The network interface is additionally configured to determine that the data unit conforms to the first communication protocol when the first generated CRC matches the received CRC, and determine that the data unit conforms to the second communication protocol when the second generated CRC matches the received CRC.

In other embodiments, the apparatus includes any combination of one or more of the following features.

The one or more integrated circuits are configured to generate the first CRC the first CRC according to a first CRC polynomial, the first CRC polynomial specified for the field by the first communication protocol.

The one or more integrated circuits are configured to generate the second CRC according to a second CRC polynomial, the second CRC polynomial specified for the field by the second communication protocol, wherein the second CRC polynomial is different than the first CRC polynomial.

The one or more integrated circuits are configured to generate the second CRC at least by generating a plurality of CRC bits according to the first CRC polynomial, and encrypting one or more bits of the plurality of CRC bits to generate the second CRC.

The one or more integrated circuits are configured to generate the first CRC according to a first CRC polynomial, the first CRC polynomial specified for the field by the first communication protocol.

The one or more integrated circuits are configured to generate the second CRC at least by generating a plurality of CRC bits according to the first CRC polynomial, selecting a subset of the plurality of CRC bits, the subset to be utilized for the CRC for the second CRC; and encrypting one or more bits in the selected subset of the plurality of CRC bits to generate the second CRC.

In still another embodiment, a method for generating a data unit for transmission via a communication channel, the data unit conforming to a first communication protocol, includes generating a preamble of the data unit, wherein the preamble includes a first field having a plurality of orthogonal frequency division multiplexing (OFDM) symbols, including at least (i) a first OFDM symbol, (i) a second OFDM symbol, and (iii) a third OFDM symbol. The first OFDM symbol is formatted such that the first OFDM symbol is decodable by a receiver device that conforms to a second communication protocol, but does not conform to the first communication protocol, to determine that the data unit conforms to a third communication protocol. The second OFDM symbol is formatted such that the first OFDM symbol and the second OFDM symbol are decodable by a receiver device that conforms to a fourth communication protocol, but does not conform to the first communication protocol, to determine that the data unit conforms to the third communication protocol. The third OFDM symbol is formatted such that a receiver device that conforms to the first communication protocol can determine that the data unit conforms to the first communication protocol. The method also includes generating the data unit to include at least the preamble.

In other embodiments, the method includes any combination of one or more of the following elements.

A second field of the preamble substantially conforms to the third communication protocol, and wherein the second field includes a rate and a length subfield that indicate the duration of the data unit.

The first OFDM symbol is modulated using the same modulation as the second OFDM symbol, wherein the modulation is different than the modulation specified for the corresponding OFDM symbols by the second communication protocol.

The second communication protocol conforms to the Institute for Electrical and Electronics Engineers (IEEE) 802.11n Standard.

The third communication protocol conforms to the IEEE 802.11a Standard.

The fourth communication protocol conforms to the IEEE 802.11ac Standard.

The first communication protocol is a communication protocol that supports a higher throughput than the IEEE 802.11ac Standard.

In still another embodiment, an apparatus comprises a network interface having one or more integrated circuits configured to generate configured to generate a preamble of the data unit, wherein the preamble includes a first field having a plurality of orthogonal frequency division multiplexing (OFDM) symbols, including at least (i) a first OFDM symbol, (ii) a second OFDM symbol, and (iii) a third OFDM symbol. The first OFDM symbol is formatted such that the first OFDM symbol is decodable by a receiver device that conforms to a second communication protocol, but does not conform to the first communication protocol, to determine that the data unit conforms to a third communication protocol. The second OFDM symbol is formatted such that the first OFDM symbol and the second OFDM symbol are decodable by a receiver device that conforms to a fourth communication protocol, but does not conform to the first communication protocol, to determine that the data unit conforms to the third communication protocol. The third OFDM symbol is formatted such that a receiver device that conforms to the first communication protocol can determine that the data unit conforms to the first communication protocol. The network interface is also configured to generate the data unit to include at least the preamble.

In other embodiments, the apparatus includes any combination of one or more of the following features.

The one or more integrated circuits are configured to generate a second field of the preamble, wherein the second field (i) substantially conforms to the third communication protocol, and (ii) includes a rate and a length subfield that indicate the duration of the data unit.

The one or more integrated circuits are configured to generate to modulate the first OFDM symbol using the same modulation as the second OFDM symbol, wherein the modulation is different than the modulation specified for the corresponding OFDM symbols by the second communication protocol.

DETAILED DESCRIPTION

In embodiments described below, a wireless network device such as an access point (AP) of a wireless local area network (WLAN) transmits data streams to one or more client stations. The AP is configured to operate with client stations according to at least a first communication protocol. The first communication protocol, according to some embodiments, is referred herein as "ultra high throughput" or "UHT" communication protocol. In some embodiments, different client stations in the vicinity of the AP are configured to operate according to one or more other communication protocols which define operation in the same frequency band as the UHT communication protocol but with generally lower data throughputs. The lower data throughput communication protocols (e.g., IEEE 802.11a, IEEE 802.11n, and/or IEEE 802.11ac) are collectively referred herein as "legacy" communication protocols. When the AP transmits a data unit according to the UHT communication protocol, a preamble of the data is formatted such that a client station that operates according to a legacy protocol, and not the UHT communication protocol, is able to determine certain information regarding the data unit, such as a duration of the data unit, and/or that the data unit does not conform to the second protocol. Additionally, a preamble of the data unit is formatted such that a client station that operates according to the UHT protocol is able to determine the data unit conforms to the UHT communication protocol. Similarly, a client station configured to operate according to the UHT communication protocol also transmits data units such as described above.

In at least some embodiments, data units formatted such as described above are useful, for example, with an AP that is configured to operate with client stations according to a plurality of different communication protocols and/or with WLANs in which a plurality of client stations operate according to a plurality of different communication protocols. Continuing with the example above, a communication device configured to operate according to both the UHT communication protocol and a legacy communication protocol is able to determine that the data unit is formatted according to the UHT communication protocol and not the legacy communication protocol. Similarly, a communication device configured to operate according to a legacy communication protocol but not the UHT communication protocol is able to determine that the data unit is not formatted according to the legacy communication protocol and/or determine a duration of the data unit.

Figure 1:
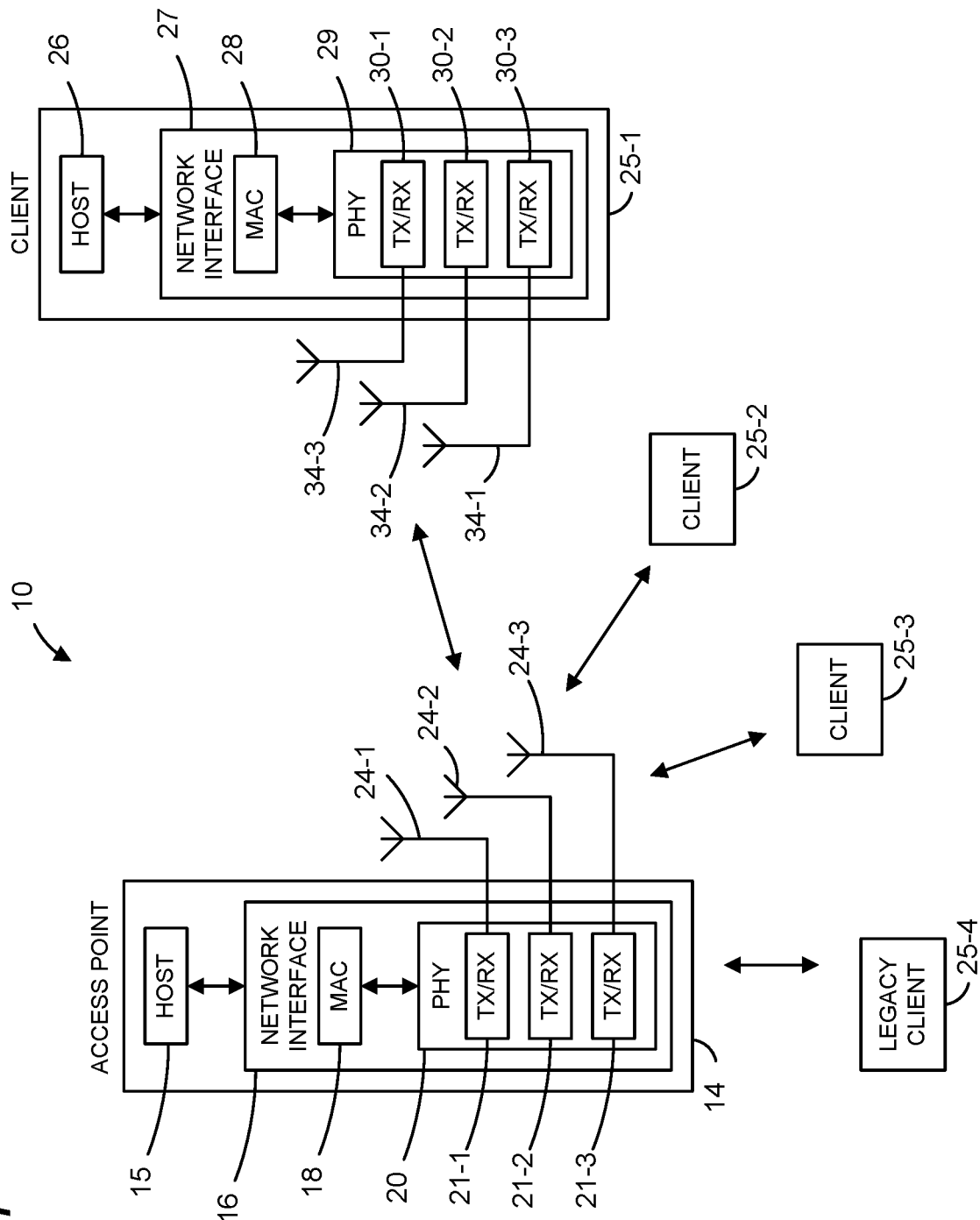
FIG. 1 is a block diagram of an example wireless local area network (WLAN) 10, according to an embodiment.

FIG. 1 is a block diagram of an example wireless local area network (WLAN) 10, according to an embodiment. An AP 14 includes a host processor 15 coupled to a network interface 16. The network interface 16 includes a medium access control (MAC) processing unit 18 and a physical layer (PHY) processing unit 20. The PHY processing unit 20 includes a plurality of transceivers 21, and the transceivers 21 are coupled to a plurality of antennas 24. Although three transceivers 21 and three antennas 24 are illustrated in FIG. 1, the AP 14 includes other suitable numbers (e.g., 1, 2, 4, 5, etc.) of transceivers 21 and antennas 24 in other embodiments. In one embodiment, the MAC processing unit 18 and the PHY processing unit 20 are configured to operate according to a first communication protocol (e.g., UHT communication protocol). In another embodiment, the MAC processing unit 18 and the PHY processing unit 20 are also configured to operate according to a second communication protocol (e.g., IEEE 802.11ac Standard). In yet another embodiment, the MAC processing unit 18 and the PHY processing unit 20 are additionally configured to operate according to the second communication protocol, a third communication protocol and/or a fourth communication protocol (e.g., the IEEE 802.11a Standard and/or the IEEE 802.11n Standard).

The WLAN 10 includes a plurality of client stations 25. Although four client stations 25 are illustrated in FIG. 1, the WLAN 10 includes other suitable numbers (e.g., 1, 2, 3, 5, 6, etc.) of client stations 25 in various scenarios and embodiments. At least one of the client stations 25 (e.g., client station 25-1) is configured to operate at least according to the first communication protocol. In some embodiments, at least one of the client stations 25 is not configured to operate according to the first communication protocol but is configured to operate according to at least one of the second communication protocol, the third communication protocol and/or the fourth communication protocol (referred to herein as a "legacy client station").

The client station 25-1 includes a host processor 26 coupled to a network interface 27. The network interface 27 includes a MAC processing unit 28 and a PHY processing unit 29. The PHY processing unit 29 includes a plurality of transceivers 30, and the transceivers 30 are coupled to a plurality of antennas 34. Although three transceivers 30 and three antennas 34 are illustrated in FIG. 1, the client station 25-1 includes other suitable numbers (e.g., 1, 2, 4, 5, etc.) of transceivers 30 and antennas 34 in other embodiments.

According to an embodiment, the client station 25-4 is a legacy client station, i.e., the client station 25-4 is not enabled to receive and fully decode a data unit that is transmitted by the AP 14 or another client station 25 according to the first communication protocol. Similarly, according to an embodiment, the legacy client station 25-4 is not enabled to transmit data units according to the first communication protocol. On the other hand, the legacy client station 25-4 is enabled to receive and fully decode and transmit data units according to the second communication protocol, the third communication protocol and/or the fourth communication protocol.

In an embodiment, one or both of the client stations 25-2 and 25-3, has a structure the same as or similar to the client station 25-1. In an embodiment, the client station 25-4, has a structure similar to the client station 25-1. In these embodiments, the client stations 25 structured the same as or similar to the client station 25-1 have the same or a different number of transceivers and antennas. For example, the client station 25-2 has only two transceivers and two antennas, according to an embodiment.

In various embodiments, the PHY processing unit 20 of the AP 14 is configured to generate data units conforming to the first communication protocol and having formats described hereinafter. The transceiver(s) 21 is/are configured to transmit the generated data units via the antenna(s) 24. Similarly, the transceiver(s) 24 is/are configured to receive the data units via the antenna(s) 24. The PHY processing unit 20 of the AP 14 is configured to process received data units conforming to the first communication protocol and having formats described hereinafter and to determine that such data units conform to the first communication protocol, according to various embodiments.

In various embodiments, the PHY processing unit 29 of the client device 25-1 is configured to generate data units conforming to the first communication protocol and having formats described hereinafter. The transceiver(s) 30 is/are configured to transmit the generated data units via the antenna(s) 34. Similarly, the transceiver(s) 30 is/are configured to receive data units via the antenna(s) 34. The PHY processing unit 29 of the client device 25-1 is configured to process received data units conforming to the first communication protocol and having formats described hereinafter and to determine that such data units conform to the first communication protocol, according to various embodiments.

Figure 2A:
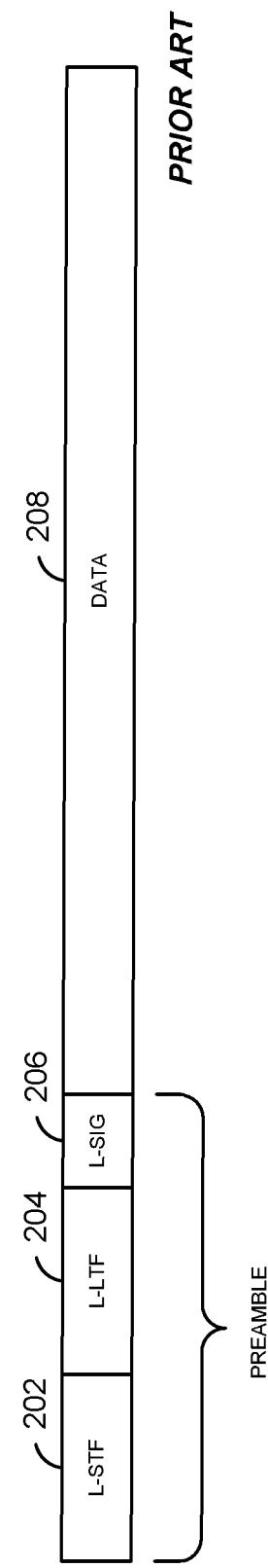
FIGS. 2A and 2B are diagrams of a prior art data unit format.
Figure 2B:

FIG. 2A is a diagram of a prior art OFDM data unit 200 that the AP 14 is configured to transmit to the client station 25-4 via orthogonal frequency division multiplexing (OFDM) modulation, according to an embodiment. In an embodiment, the client station 25-4 is also configured to transmit the data unit 200 to the AP 14. The data unit 200 conforms to the IEEE 802.11a Standard and occupies a 20 Megahertz (MHz) band. The data unit 200 includes a preamble having a legacy short training field (L-STF) 202, generally used for packet detection, initial synchronization, and automatic gain control, etc., and a legacy long training field (L-LTF) 204, generally used for channel estimation and fine synchronization. The data unit 200 also includes a legacy signal field (L-SIG) 206, used to carry certain physical layer (PHY) parameters of with the data unit 200, such as modulation type and coding rate used to transmit the data unit, for example. The data unit 200 also includes a data portion 208. FIG. 2B is a diagram of example data portion 208 (not low density parity check encoded), which includes a service field, a scrambled physical layer service data unit (PSDU), tail bits, and padding bits, if needed. The data unit 200 is designed for transmission over one spatial or space-time stream in a single input single output (SISO) channel configuration.

Figure 3:
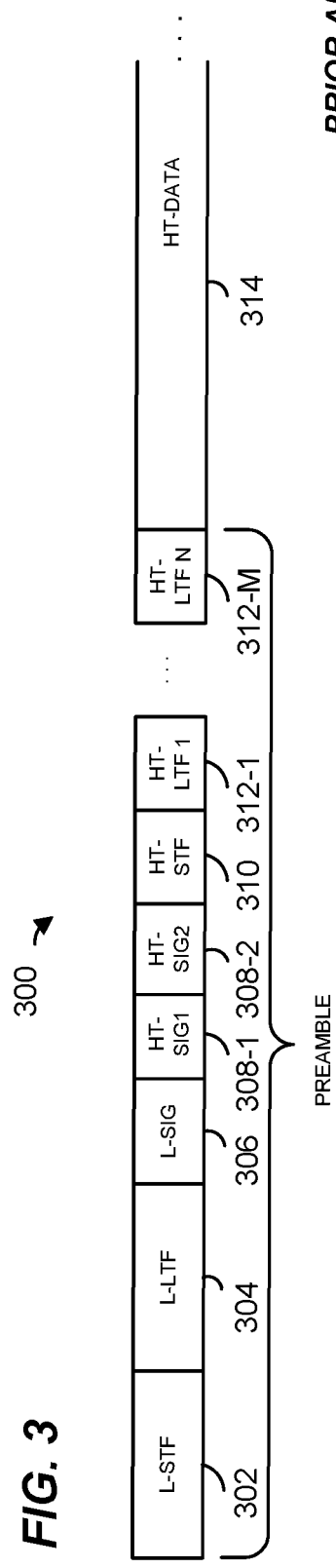
FIG. 3 is a diagram of another prior art data unit format.

FIG. 3 is a diagram of a prior art OFDM data unit 300 that the AP 14 is configured to transmit to the client station 25-4 via orthogonal frequency domain multiplexing (OFDM) modulation, according to an embodiment. In an embodiment, the client station 25-4 is also configured to transmit the data unit 300 to the AP 14. The data unit 300 conforms to the IEEE 802.11n Standard, occupies a 20 MHz band, and is designed for mixed mode situations, i.e., when the WLAN includes one or more client stations that conform to the IEEE 802.11a Standard but not the IEEE 802.11n Standard. The data unit 300 includes a preamble having an L-STF 302, an L-LTF 304, an L-SIG 306, a high throughput signal field (HT-SIG) 308, a high throughput short training field (HT-STF) 310, and M data high throughput long training fields (HT-LTFs) 312, where M is an integer generally determined by the number of spatial streams used to transmit the data unit 300 in a multiple input multiple output (MIMO) channel configuration. In particular, according to the IEEE 802.11n Standard, the data unit 300 includes two HT-LTFs 312 if the data unit 300 is transmitted using two spatial streams, and four HT-LTFs 312 is the data unit 300 is transmitted using three or four spatial streams. An indication of the particular number of spatial streams being utilized is included in the HT-SIG field 308. The data unit 300 also includes a data portion 314.

Figure 4:
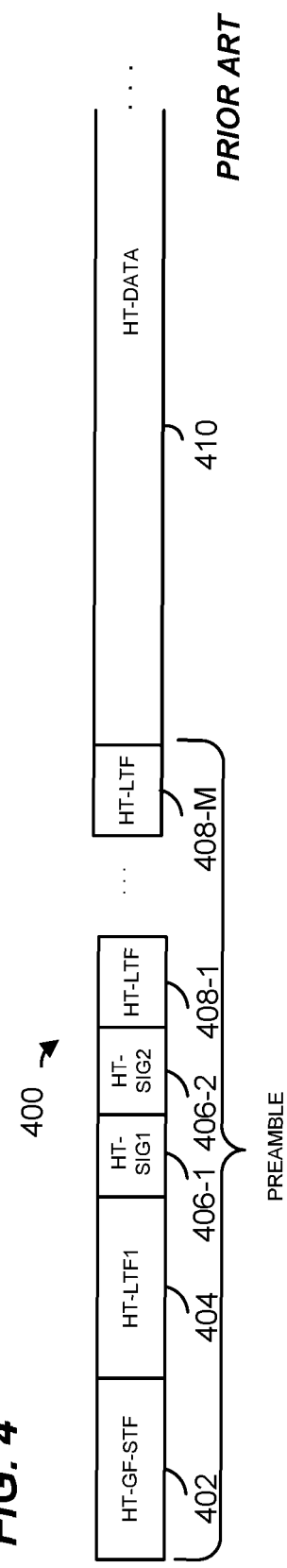
FIG. 4 is a diagram of another prior art data unit format.

FIG. 4 is a diagram of a prior art OFDM data unit 400 that the AP 14 is configured to transmit to the client station 25-4 via orthogonal frequency domain multiplexing (OFDM) modulation, according to an embodiment. In an embodiment, the client station 25-4 is also configured to transmit the data unit 400 to the AP 14. The data unit 400 conforms to the IEEE 802.11n Standard, occupies a 20 MHz band, and is designed for "Greenfield" situations, i.e., when the WLAN does not include any client stations that conform to the IEEE 802.11a Standard but not the IEEE 802.11n Standard. The data unit 400 includes a preamble having a high throughput Greenfield short training field (HT-GF-STF) 402, a first high throughput long training field (HT-LTF1) 404, a HT-SIG 406, and M data HT-LTFs 408, where M is an integer which generally corresponds to a number of spatial streams used to transmit the data unit 400 in a multiple input multiple output (MIMO) channel configuration. The data unit 400 also includes a data portion 410.

Figure 5:
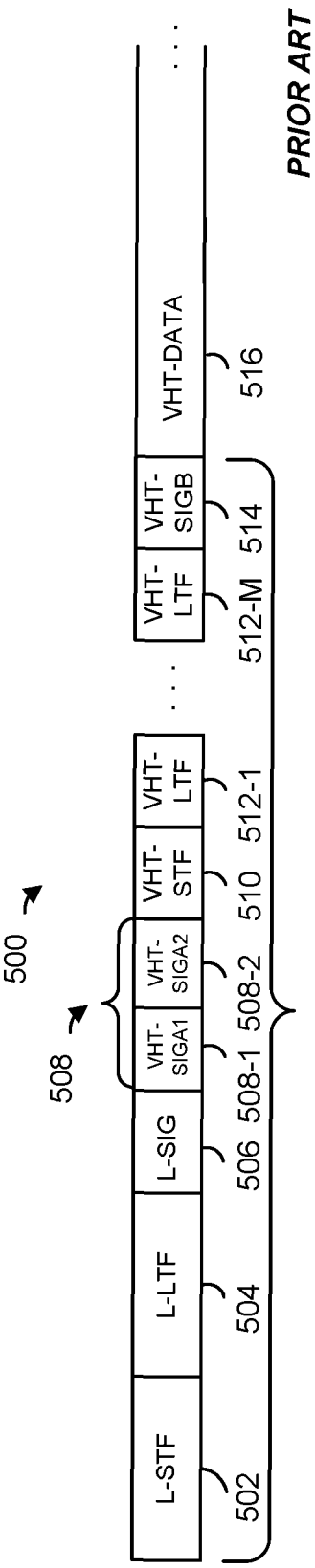
FIG. 5 is a diagram of another prior art data unit format.

FIG. 5 is a diagram of a prior art OFDM data unit 500 that the client station AP 14 is configured to transmit to the client station 25-4 via orthogonal frequency domain multiplexing (OFDM) modulation, according to an embodiment. In an embodiment, the client station 25-4 is also configured to transmit the data unit 500 to the AP 14. The data unit 500 conforms to the IEEE 802.11ac Standard and is designed for "Mixed field" situations. The data unit 500 occupies a 20 MHz bandwidth. In other embodiments or scenarios, a data unit similar to the data unit 500 occupies a different bandwidth, such as a 40 MHz, an 80 MHz, or a 160 MHz bandwidth. The data unit 500 includes a preamble having an L-STF 502, an L-LTF 504, an L-SIG 506, two first very high throughput signal fields (VHT-SIGAs) 508 including a first very high throughput signal field (VHT-SIGA1) 508-1 and a second very high throughput signal field (VHT-SIGA2) 508-2, a very high throughput short training field (VHT-STF) 510, M very high throughput long training fields (VHT-LTFs) 512, where M is an integer, and a second very high throughput signal field (VHT-SIG-B) 514. The data unit 500 also includes a data portion 516.

Figure 6A:
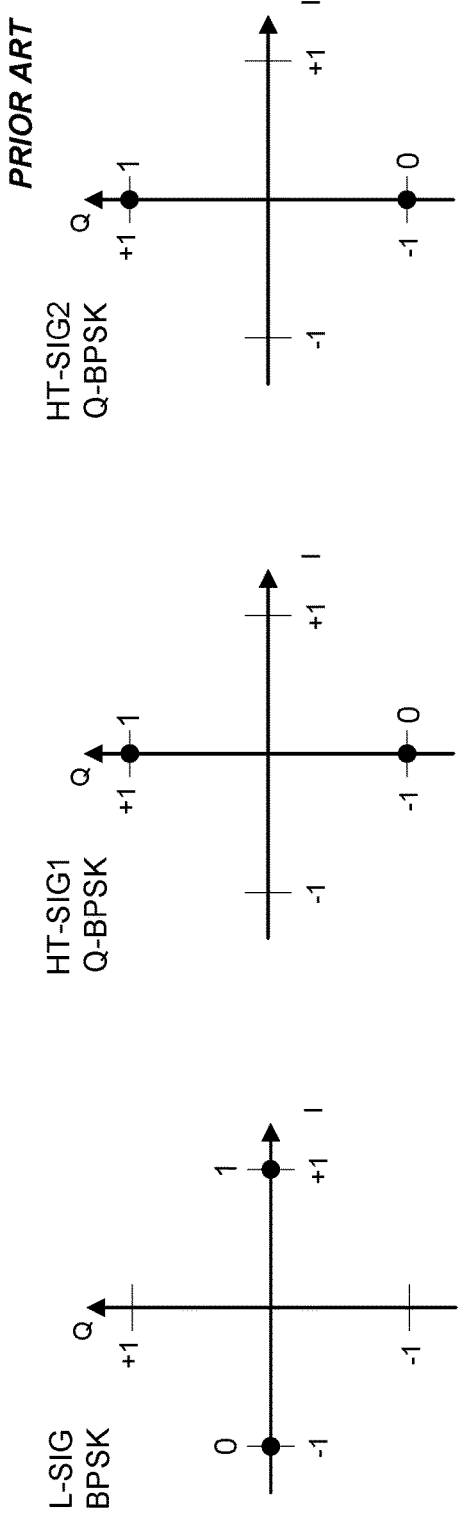
FIG. 6A illustrates diagrams of modulation used to modulate symbols in a prior art data unit.

FIG. 6A is a set of diagrams illustrating modulation of the L-SIG, HT-SIG1, and HT-SIG2 fields of the data unit 300 of FIG. 3, as defined by the IEEE 802.11n Standard. The L-SIG field is modulated according to binary phase shift keying (BPSK), whereas the HT-SIG1 and HT-SIG2 fields are modulated according to BPSK, but on the quadrature axis (Q-BPSK). In other words, the modulation of the HT-SIG1 and HT-SIG2 fields is rotated by 90 degrees as compared to the modulation of the L-SIG field.

Figure 6B:
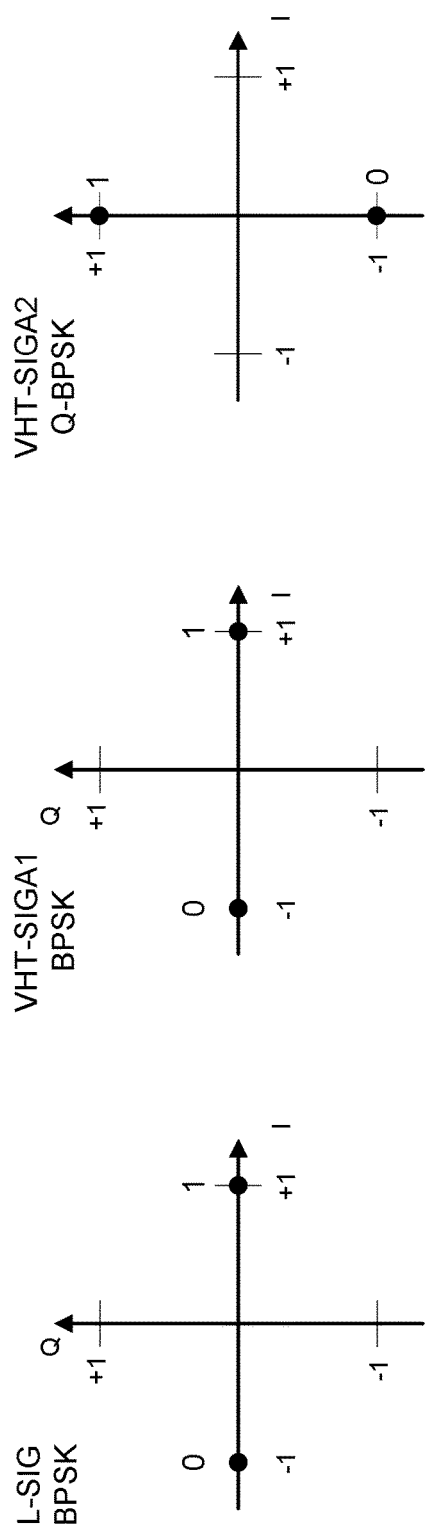
FIG. 6B illustrates diagrams of modulation used to modulate symbols in an example data unit, according to an embodiment.

FIG. 6B is a set of diagrams illustrating modulation of the L-SIG, VHT-SIGA1, and VHT-SIGA2 fields of the data unit 500 of FIG. 5, as defined by the IEEE 802.11ac Standard. Unlike the HT-SIG1 field in FIG. 6A, the VHT-SIGA1 field is modulated according to BPSK, same as the modulation of the L-SIG field. On the other hand, the VHT-SIGA2 field is rotated by 90 degrees as compared to the modulation of the L-SIG field.

Figure 7A:
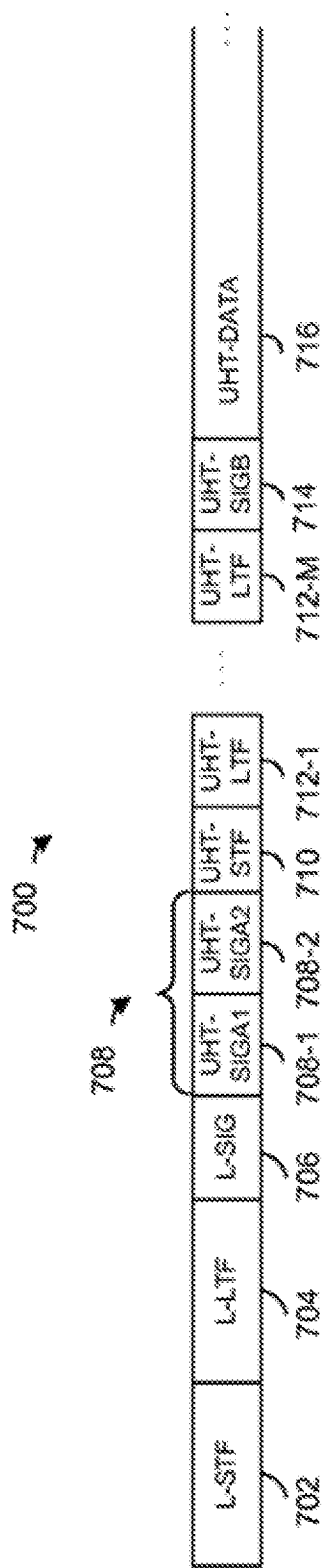
FIG. 7A is a diagram of an example data unit format, according to an embodiment.

FIG. 7A is a diagram of an OFDM data unit 700 that the client station AP 14 is configured to transmit to the client station 25-1 via orthogonal frequency domain multiplexing (OFDM) modulation, according to an embodiment. In an embodiment, the client station 25-1 is also configured to transmit the data unit 700 to the AP 14. The data unit 700 conforms to the first communication protocol and occupies a 20 MHz bandwidth. Data units similar to the data unit 700 occupy other suitable bandwidth such as 40 MHz, 80 MHz, 160 MHz, 320 MHz, 640 MHz, for example, or other suitable bandwidths, in other embodiments. The data unit 700 is suitable for "mixed mode" situations, i.e. when the WLAN 10 includes a client station (e.g., the legacy client station 24-4) that conforms to a legacy communication protocol, but not the first communication protocol. The data unit 700 is utilized in other situations as well, in some embodiments.

The data unit 700 includes a preamble having an L-STF 702, an L-LTF 704, an L-SIG 706, two first ultra high throughput signal fields (UHT-SIGAs) 708 including a first ultra high throughput signal field (UHT-SIGA1) 708-1 and a second ultra high throughput signal field (UHT-SIGA2) 708-2, an ultra high throughput short training field (UHT-STF) 710, M ultra high throughput long training fields (UHT-LTFs) 712, where M is an integer, and a third ultra high throughput signal field (UHT-SIGB) 714. In an embodiment, the UHT-SIGAs 708 comprise two OFDM symbols, where the UHT-SIGA1 708-1 field comprises the first OFDM symbol and the UHT-SIGA2 comprises the second OFDM symbol. In at least some examples, the UHT-SIGAs 708 are collectively referred to as a single very high throughput signal field (UHT-SIGA) 708. In some embodiments, the data unit 700 also includes a data portion 716. In other embodiments, the data unit 700 omits the data portion 716.

In the embodiment of FIG. 7A, the data unit 700 includes one of each of the L-STF 702, the L-LTF 704, the L-SIG 706, the UHT-SIGA1s 708. In other embodiments in which an OFDM data unit similar to the data unit 700 occupies a cumulative bandwidth other than 20 MHz, each of the L-STF 702, the L-LTF 704, the L-SIG 706, the UHT-SIGA1s 708 is repeated over a corresponding number of 20 MHz sub-bands of the whole bandwidth of the data unit, in an embodiment. For example, in an embodiment, the OFDM data unit occupies an 80 MHz bandwidth and, accordingly, includes four of each of the L-STF 702, the L-LTF 704, the L-SIG 706, the UHT-SIGA1s 708, in an embodiment. In some embodiments, the modulation of different 20 MHz sub-bands signals is rotated by different angles. For example, in one embodiment, a first subband is rotated 0-degrees, a second subband is rotated 90-degrees, a third sub-band is rotated 180-degrees, and a fourth sub-band is rotated 270-degrees. In other embodiments, different suitable rotations are utilized. The different phases of the 20 MHz sub-band signals result in reduced peak to average power ratio (PAPR) of OFDM symbols in the data unit 700, in at least some embodiments. In an embodiment, if the data unit that conforms to the first communication protocol is an OFDM data unit that occupies a cumulative bandwidth such as 20 MHz, 40 MHz, 80 MHz, 160 MHz, 320 MHz, 640 MHz, etc., the UHT-STF, the UHT-LTFs, the UHT-SIGB and the UHT data portion occupy the corresponding whole bandwidth of the data unit.

Figure 7B:
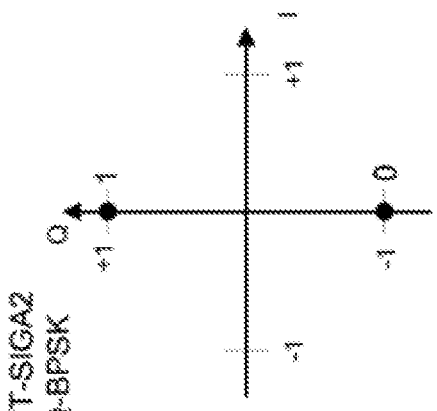
FIGS. 7B-7D are diagrams illustrating modulation of the signal fields of the example data unit format of FIG. 7A, according to an embodiment.
Figure 7C:
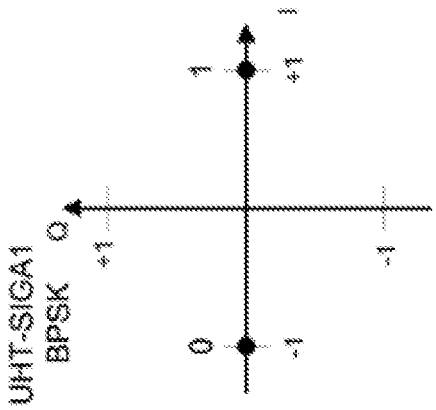
Figure 7D:
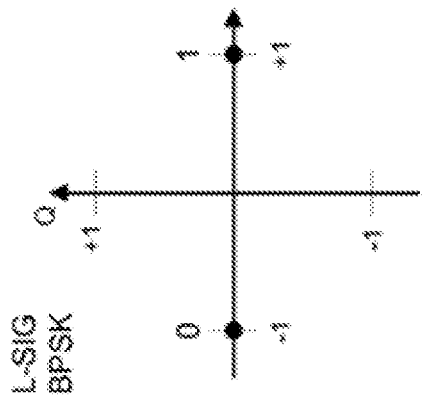

FIGS. 7B, 7C and 7D are diagrams illustrating modulation of the L-SIG 706, UHT-SIGA1 708-1, and UHT-SIGA2 708-2, respectively, of the data unit 700 of FIG. 7A, according to an embodiment. In this embodiment, the L-SIG 706, UHT-SIGA1 708-1, and UHT-SIGA2 708-2 fields have the same modulation as the modulation of the corresponding field as defined in the IEEE 802.11ac Standard and depicted in FIG. 6B. Accordingly, the UHT-SIGA1 field is modulated the same as the L-SIG field. On the other hand, the UHT-SIGA2 field is rotated by 90 degrees as compared to the modulation of the L-SIG field.

In an embodiment, because the modulations of the L-SIG 706, UHT-SIGA1 708-1, and UHT-SIGA2 708-2 fields of the data unit 700 correspond to the modulations of the corresponding fields in a data unit that conforms to the IEEE 802.11ac Standard (e.g., the data unit 500 of FIG. 5), legacy client stations configured to operate according to the IEEE 802.11a Standard and/or the IEEE 802.11n Standard will assume, in at least some circumstances, that the data unit 700 conforms to the IEEE 802.11ac Standard and will process the data unit 700 accordingly. For example, a client station the conforms to the IEEE 802.11a Standard will recognize the legacy IEEE 802.11a Standard portion of the preamble of the data unit 700 and will set the data unit duration according to a duration indicated in the L-SIG 706. For example, the legacy client station will calculate a duration based on a rate and a length (e.g., in number of bytes) indicated in the L-SIG field 706, according to an embodiment. In an embodiment, the rate and the length in the L-SIG field 706 are set such that a client station configured to operate according to a legacy communication protocol will calculate, based the rate and the length, a packet duration (T) that corresponds to, or at least approximates, the actual duration of the data unit 700. For example, the rate is set to indicate a lowest rate defined by the IEEE 802.11a Standard (i.e., 6 Mbps), and the length is set to a value computed such that packet duration computed using the lowest rate at least approximates the actual duration of the data unit 700, in one embodiment.

In an embodiment, a legacy client station that conforms to the IEEE 802.11a Standard, when receiving the data unit 700, will compute a packet duration for the data unit 700, e.g., using a rate and a length fields of L-SIG field 706, and will wait until the end of the computed packet duration before performing clear channel assessment (CCA), in an embodiment. Thus, in this embodiment, communication medium is protected against access by the legacy client station at least for the duration of the data unit 700. In an embodiment, the legacy client station will continue decoding the data unit 700, but will fail an error check (e.g., using a frame check sequence (FCS)) at the end of the data unit 700.

Similarly, a legacy client station configured to operate according to the IEEE 802.11n Standard, when receiving the data unit 700, will compute a packet duration (T) of the data unit 700 based on the rate and the length indicated in the L-SIG 706 of the data unit 700, in an embodiment. The legacy client station will detect the modulation of the first UHT signal field (UHT-SIGA1) 708-1 (BPSK) and will assume that the data unit 700 is a legacy data unit that conforms to the IEEE 802.11a Standard. In an embodiment, the legacy client station will continue decoding the data unit 700, but will fail an error check (e.g., using a frame check sequence (FCS)) at the end of the data unit. In any event, according to the IEEE 802.11n Standard, the legacy client station will wait until the end of a computed packet duration (T) before performing clear channel assessment (CCA), in an embodiment. Thus, communication medium will be protected from access by the legacy client station for the duration of the data unit 700, in an embedment.

A legacy client station configured to operate according to the IEEE 802.11ac Standard but not the first communication protocol, when receiving the data unit 700, will compute a packet duration (T) of the data unit 700 based on the rate and the length indicated in the L-SIG 706 of the data unit 700, in an embodiment. However, the legacy client station will not be able to detect, based on the modulation of the data unit 700, that the data unit 700 does not conform to the IEEE 802.11ac Standard, in an embodiment. In some embodiments, one or more UHT signal fields (e.g., the UHT-SIGA1 and/or the UHT-SIGA2) of the data unit 700 is/are formatted to intentionally cause the legacy client station to detect an error when decoding the data unit 700, and to therefore stop decoding (or "drop") the data unit 700. For example, UHT-SIGA 708 of the data unit 700 is formatted to intentionally cause an error when the SIGA field is decoded by a legacy device according to the IEEE 802.11ac Standard, in an embodiment. Further, according to the IEEE 802.11ac Standard, when an error is detected in decoding the VHT-SIGA field, the client station will drop the data unit 700 and will wait until the end of a computed packet duration (T), calculated, for example, based on a rate and a length indicated in the L-SIG 706 of the data unit 700, before performing clear channel assessment (CCA), in an embodiment. Thus, communication medium will be protected from access by the legacy client station for the duration of the data unit 700, in an embedment.

Figures 8A, 8B, 8C:
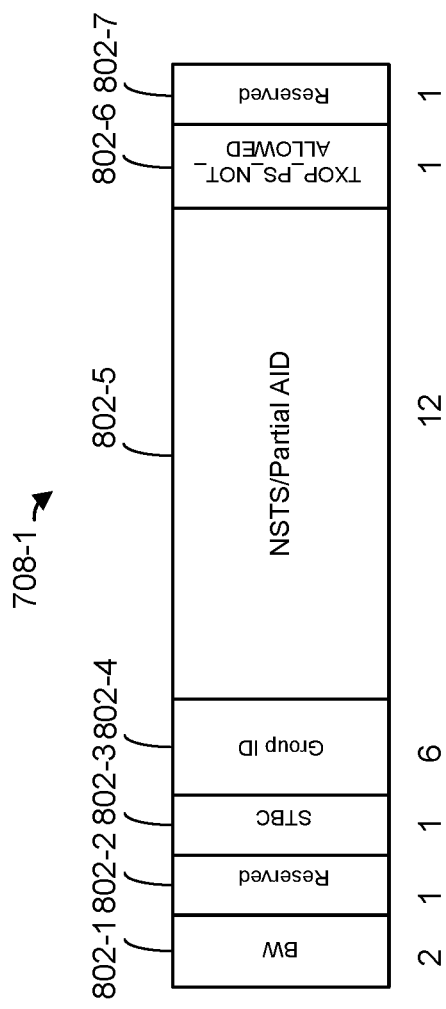
FIGS. 8A-8F are diagrams of example bit allocations for a signal field, according to an embodiment.
Figure 8D:
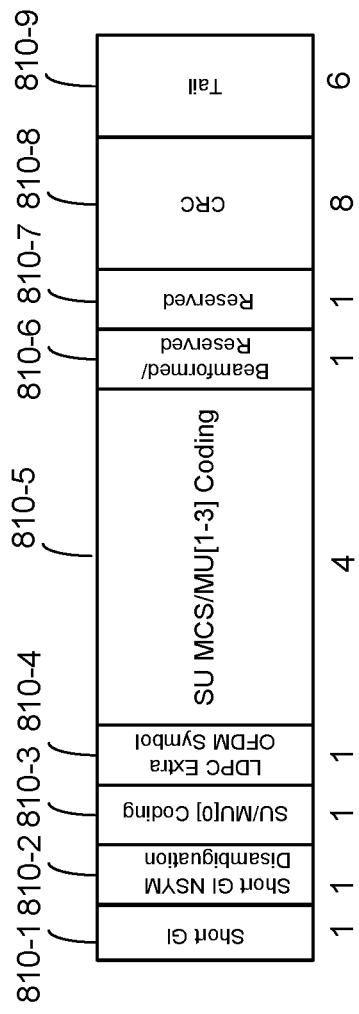
Figure 8E:
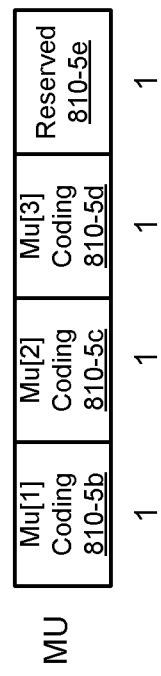
Figure 8F:
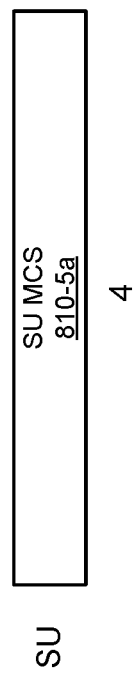

FIGS. 8A-8F are diagrams of example bit allocations for various portions of the UHT-SIGA field 708, according to an embodiment. In particular, FIGS. 8A-8C are diagrams of example bit allocations for the UHT-SIGA1 field 708-1 (or portions of the UHT-SIGA1 field 708-1), and FIGS. 8D-8F are diagrams of example bit allocations for the UHT-SIGA2 field 708-2 (or portions of the UHT-SIGA1 field 708-2), according to an embodiment. The UHT-SIGA field 708 is generally formatted similar to a VHT-SIGA1 field as specified in the IEEE 802.11ac Standard, but one or more subfields of the UHT-SIGA field 708 are altered as compared to the corresponding subfields defined in the IEEE 802.11ac Standard and/or include values unsupported by the IEEE 802.11ac Standard to intentionally cause a legacy client station configured to operate according to the IEEE 802.11ac Standard to detect an error from the UHT-SIGA field 708, in some embodiments.

Referring to FIG. 8A, the UHT-SIGA1 field 708-1 includes a plurality of subfield 802 that collectively comprise 24 information bits, in the illustrated embodiment. The plurality of subfields 802 includes a 2-bit bandwidth (BW) subfield 802-1, a first 1-bit reserved subfield 802-2, a 1-bit space time block coding (STBC) subfield 802-3, a 6-bit Group Identification (Group ID) subfield 802-4, a 12-bit NSTS/Partial AID subfield 802-5, the content of which depends on whether the data unit 700 is a single user data unit (e.g., a data unit that used to transmit information to a single client station) or in a multiuser data unit (e.g., a data unit that includes independent data streams to multiple client stations), a 1-bit TXOP_PS_NOT_ALLOWED subfield 802-6, and a second 1-bit reserved subfield 802-7. FIGS. 8B and 8C are diagrams of the NSTS/Partial AID subfield 802-5 for a single user and a multi user data unit, respectively, according to an embodiment. Referring to FIG. 8B, in an embodiment in which the data unit 700 is a single user data unit, the NSTS/Partial AID subfield 802-5 comprises a 3-bit single user number of space-time streams subfield 802-5*a* and a 9-bit Partial AID subfield 802-5*b*. Referring to FIG. 8C, in an embodiment in which the data unit 700 is a multiuser data unit, the NSTS/Partial AID subfield 802-5 comprises four 3-bit user Nsts subfields 802-5*c* through 802-5*f*, where each of the user subfields 802-5*c* through 802-5*f* indicates a number of space time streams corresponding to a intended recipient of the signal field 800.

Referring to now FIG. 8D, the UHT-SIGA2 field 708-2 includes a plurality of subfield 810 that collectively comprise 24 information bits, in the illustrated embodiment. The plurality of subfields 810 includes a 1-bit Short GI subfield 810-1, a 1-bit Short GI NSYM Disambiguation subfield 810-2, a 1-bit SU/MU[0] Coding subfield 910-3, a 1-bit LDPC Extra OFDM Symbol subfield 810-4, a 12-bit SU MCS/MU[1-3] Coding subfield 910-5, the content of which depends on whether the data unit 700 is a single user data unit or a multiuser data unit, a 1-bit beamsteering/reserved subfield 810-6, a reserved subfield 810-7, an 8-bit cyclic redundancy check (CRC) subfield 810-8, and a tail subfield 801-9. FIGS. 8E and 8F are diagrams of the SU MCS/MU [1-3] Coding subfield 810-5 for a single user and a multi user data unit, respectively. Referring to FIG. 8E, in an embodiment in which the data unit 700 is a single user data unit, the SU MCS/MU[1-3] Coding subfield 810-5 comprises a 4-bit single SU MCS subfield 810-5*a*. Referring to FIG. 8F, in an embodiment in which the data unit 700 is a multiuser data unit, the SU MCS/MU[1-3] Coding subfield 810-5 comprises four 1-bit subfields 810-5*b* through 810-5*e*, where each of the subfields 810-5*b* through 810-5*d* indicates a coding utilized for a particular intended recipient of the signal field 810, and the subfield 810-5*e* is reserved.

In some embodiments, a signal field of a data unit that conforms to the first communication protocol (e.g., the UHT-SIGA field 708 of the data unit 700) is formatted similarly to a corresponding signal field of a legacy data unit specified by a legacy communication protocol (e.g., the VHT-SIGA as specified in the IEEE 802.11ac Standard), but with a set of one or more information bits generated differently than the corresponding information bits generated according to the legacy communication protocol. For example, the set of one or more information bits includes information bits generated an error detection scheme (e.g., CRC) not specified by the legacy communication protocol, in an embodiment. As another example, the set of one or more information bits includes information bits set to indicate a mode not supported by the legacy communication protocol, in an embodiment. The differences between the signal field formatted according to the first communication protocol and a signal field formatted according to the legacy communication protocol cause a receiving device that conforms to the second communication protocol, but not the first communication protocol, to detect an error when decoding a signal field of a data unit that conforms to the first communication protocol, in at least some embodiments and/or scenarios. Further, such differences permit a receiver device that conforms to the first communication protocol whether a data unit being received conforms to the first communication protocol or to a legacy communication protocol, in at least some embodiments.

For example, in some embodiments, CRC to be included in the CRC subfield 810-8 (FIG. 8C) is generated differently than CRC specified for the VHT-SIGA field by the IEEE 802.11ac Standard. The different CRC for the UHT-SIGA 708 field will cause a CRC error when the UHT-SIGA field 708 is decoded by a client station that conforms to the IEEE 802.11ac Standard, but not the first communication protocol, in an embodiment. Further, the different CRC will permit a client station that conforms to the first communication protocol to determine that the data unit 700 conforms to the first communication protocol, in an embodiment.

Figure 9A:
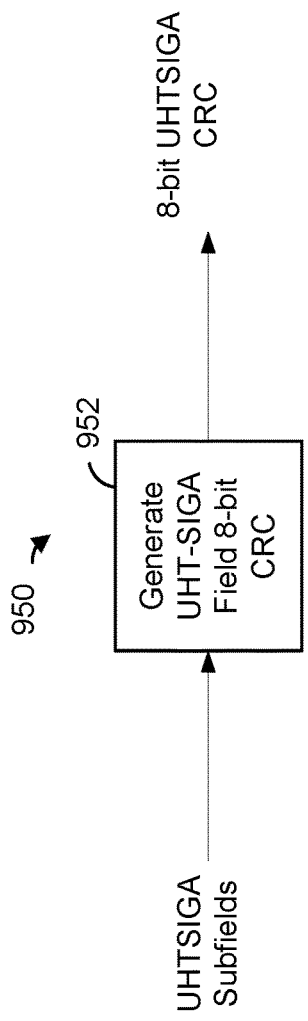
FIGS. 9A-9C are diagrams depicting several example cyclic redundancy check (CRC) generation schemes, according to several embodiments.
Figure 9B:
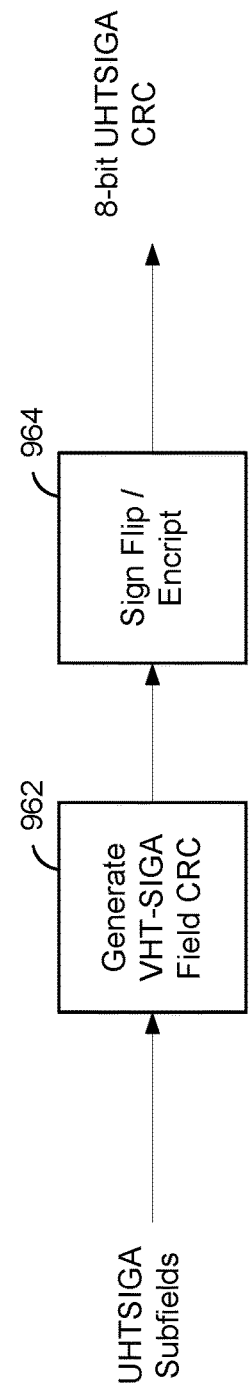
Figure 9C:
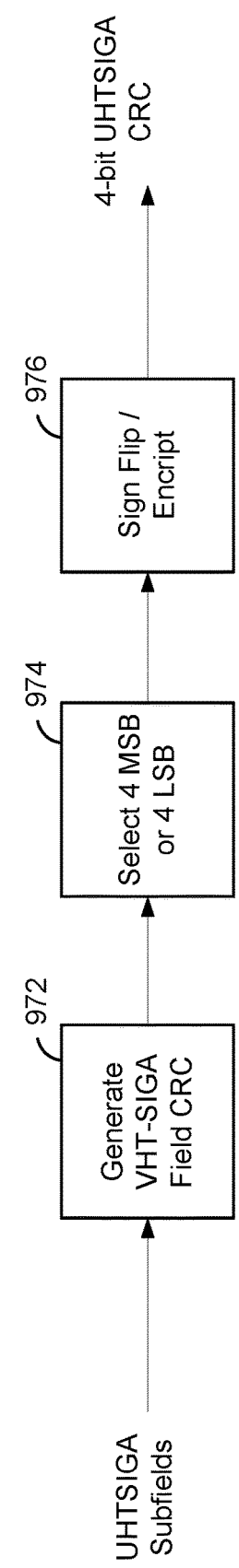

FIGS. 9A-9C are diagrams depicting several example CRC generation schemes 950, 960, 970 used for generating CRC for a UHT-SIGA field of a data unit that conforms to the first communication protocol, according to some embodiments. In various embodiments, the CRC generation schemes 950, 960, 970 are used to generate the CRC subfield 810-8 (FIG. 8D) or a CRC field for another suitable UHT-SIGA field of a data unit that conforms to the first communication protocol.

Referring to FIG. 9A, according to the CRC generation scheme 950, an 8-bit CRC for the UHT-SIGA field is generated using a polynomial that is different from the polynomial specified for the VHT-SIGA field in the IEEE 802.11ac Standard, in an embodiment. For example, an 8-bit polynomial at least substantially orthogonal to the polynomial specified for the VHT-SIGA field is utilized at block 952, in one embodiment. In other embodiments, other suitable polynomials different from the CRC polynomial specified for the VHT-SIGA field are utilized at block 952. Referring now to FIG. 9B, according to the CRC generation scheme 960, an 8-bit CRC for the UHT-SIGA 708 is generated using the polynomial specified for the VHT-SIGA field in the IEEE 802.11ac Standard (block 962), but one or more bits of the generated CRC are flipped (i.e., "0" changed to "1" and "1" changed to "0"), or otherwise encrypted (block 964), in this embodiment.

Referring now to FIG. 9C, according to the CRC generation scheme 970, a CRC having less bits than the 8-bit CRC specified for the VHT-SIGA field in the IEEE 802.11ac Standard is generated for the UHT-SIGA field, in an embodiment. For example, a 4-bits CRC is generated for the UHT-SIGA, in some embodiments. The 4-bit CRC is generated, for example, using the polynomial specified for the VHT-SIGA field in the IEEE 802.11ac Standard (block 972). Then, a 4-bit subset of the generated CRC (block 974) is selected. For example, the four most significant bits (MSB) or the four most significant bits (LSB) of the generated CRC (block 974) are selected, in some embodiments, Further, one or more bits of the selected 4-bit CRC are flipped (i.e., "0" changed to "1" and "1" changed to "0"), or otherwise encrypted (block 976), in this embodiment. In other embodiments, the CRC generation scheme 970 generates a CRC that is another suitable number of bits less than 8 (e.g., 7 bits, 6 bits, 5 bits, etc.). For example, a 5-bit CRC is generated using the polynomial specified for the VHT-SIGA field in the IEEE 802.11ac Standard, selecting five most significant bits (MSB) of the generated CRC, the five least significant bits (LSB) of the generated CRC, or another 5-bit subset of the generated CRC, and encrypting (e.g., flipping) one or more bits of the resulting 5-bit CRC, in some embodiments. In some embodiments in which fewer CRC bits are utilized (e.g., fewer than 8), the remaining bit locations of the UHT-SIGA field (e.g., the other ones of MSBs or LSBs of the CRC subfield 810-8 of FIG. 8D) are reserved and/or are utilized to signal additional information relevant to the first communication protocol.

While FIGS. 9A-9C depict several example CRC generation schemes utilized for the UHT-SIGA field 708 according to some embodiments, in general, any CRC generation scheme different than a CRC generation scheme specified for the VHT-SIGA field by the IEEE 802.11ac Standard can be utilized, and other suitable CRC generation are utilized to generate CRC for the UHT-SIGA field 708 in other embodiments.

As just an example, in some embodiments, CRC having less bits than the 8-bit CRC specified for the VHT-SIGA field in the IEEE 802.11ac Standard is generated for the UHT-SIGA field using a polynomial that is different from the polynomial specified by the IEEE 802.11ac Standard. For example, an x-bit CRC is generated using an x-bit polynomial designed such that the generated CRC is at least substantially uncorrelated with the corresponding bits of the VHT-SIGA CRC generated according to the IEEE 802.11ac Standard, where x is an integer between 1 and 7, in some embodiments. In some such embodiments, the remaining bit locations of the UHT-SIGA field that correspond to bit locations of the CRC subfield of a VHT-SIGA field defined by the IEEE 802.11ac Standard (e.g., the other ones of MSBs or LSBs of the CRC subfield 910-8 of FIG. 8D) are reserved or are utilized to signal additional information relevant to the first communication protocol.

In an embodiment, differences in CRC generation for the UHT-SIGA field according to the first communication protocol and for the VHT-SIGA field as defined in the IEEE 802.11ac Standard will cause a legacy client station configured to operate according to the IEEE 802.11ac Standard to detect a CRC error when decoding the data unit 700 and to therefore drop the data unit 700. Further, differences in CRC generation for the UHT-SIGA field according to the first communication protocol and for the VHT-SIGA field defined in the IEEE 802.11ac Standard will permit a client station configured to operate according to the first communication protocol, when receiving a data unit, to detect whether the data unit conforms to the first communication protocol or to the IEEE 802.11ac Standard.

Figure 10:
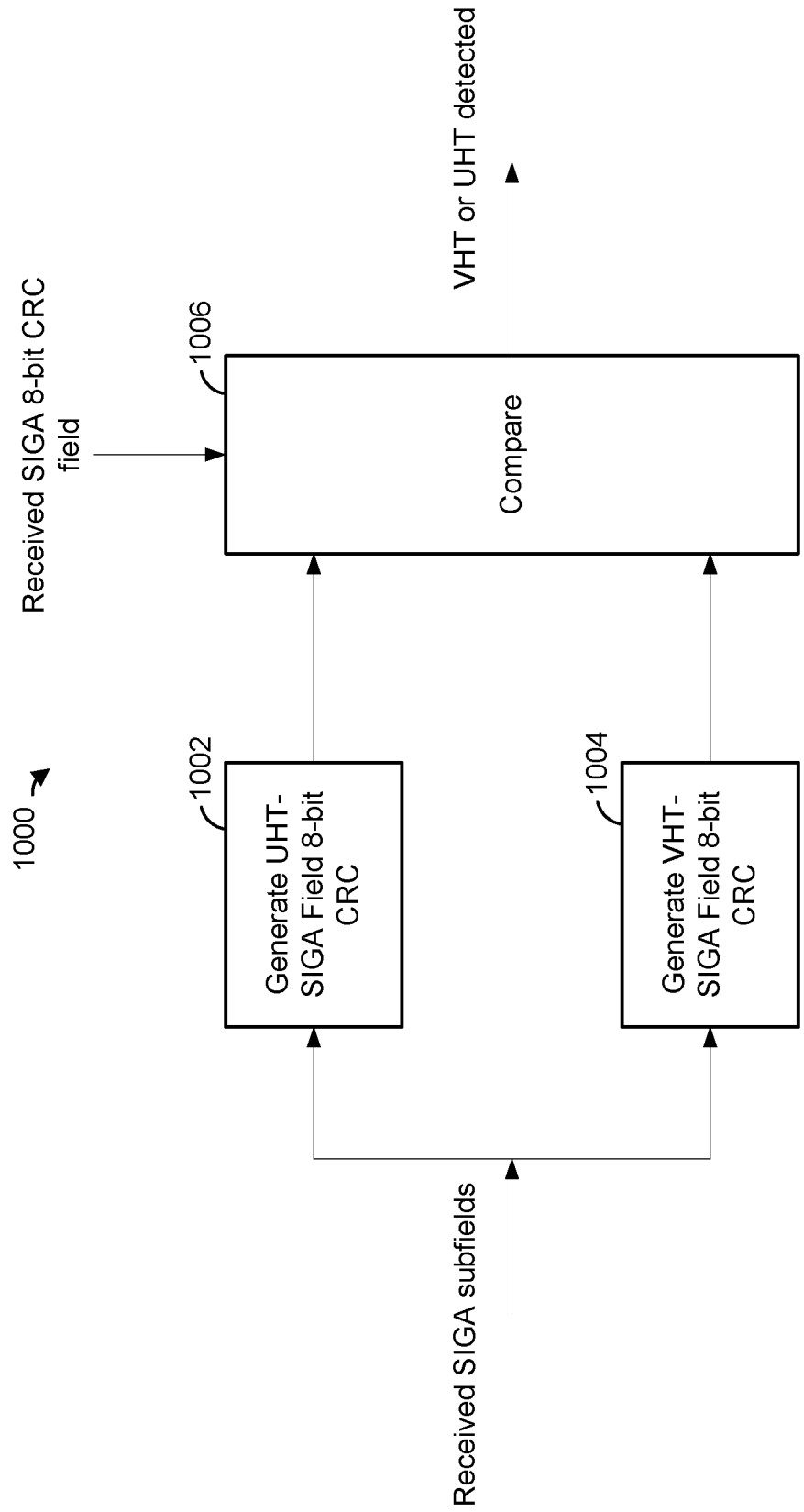
FIG. 10 is a block diagram depicting a detection scheme for detecting whether a data unit conforms to a first communication protocol or to a second communication protocol, according to an embodiment.

FIG. 10 is a block diagram depicting a detection scheme 1000 used by a client station (e.g., the client station 25-1) configured to operate according to the first communication protocol to determine whether a data unit conforms to the first communication protocol or to a legacy communication protocol (e.g., the IEEE 802.11ac Standard), according to an embodiment. The detection scheme 1000 is suitable for use in embodiments in which the UHT-SIGA field of data units conforming to the first communication protocol include a CRC having the same number of bits as CRC specified for a corresponding field by the legacy communication protocol (e.g., 8 bits). According to the detection scheme 1100, a client station receiving a data unit decodes the SIGA field of the data unit. After decoding the signal field, the client station excludes CRC bits and BCC tail bits from the decoded SIGA field to generate a set of bits based on which a CRC for the SIGA field of the data unit should be generated, in an embedment. Then, a first CRC for the SIGA field is generated (bock 1002) based on the set of bits and using a CRC generation scheme specified in the first communication protocol. A second CRC for the SIGA field is generated (bock 1004) based on the set of bits and using a CRC generation scheme specified in the legacy communication protocol (e.g., the IEEE 802.11ac Standard). The first generated CRC and the second generated CRC is each compared (bock 1006) to the received CRC that was received in the SIGA field of the data unit. When a match is detected between the received CRC and the first generated CRC, it is determined that the data unit conforms to the first communication protocol, in an embodiment. On the other hand, when a match is detected between the received CRC and the second generated CRC, it is determined that the data unit conforms to the legacy communication protocol (e.g., the IEEE 802.11ac Standard), in an embodiment.

Figure 11:
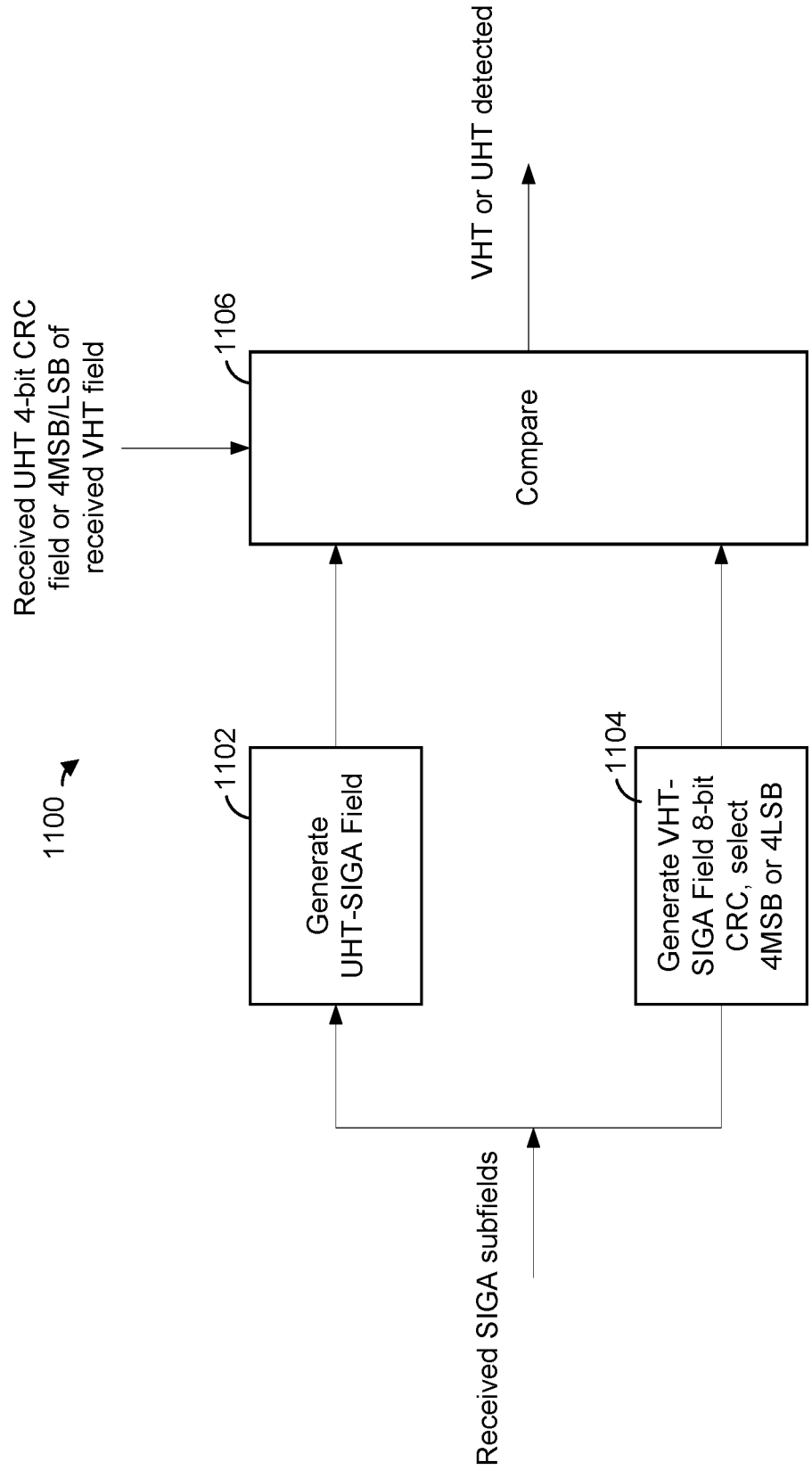
FIG. 11 is a block diagram depicting another detection scheme for detecting whether a data unit conforms to a first communication protocol or to a second communication protocol, according to an embodiment.

FIG. 11 is a block diagram depicting a detection scheme 1100 used by a client station (e.g., the client station 25-1) configured to operate according the first communication protocol to detect to whether a data unit conforms to the first communication protocol or to a legacy communication protocol, according to another embodiment. The detection scheme 1100 is suitable for use in embodiments in which the UHT-SIGA field of data units conforming to the first communication protocol include fewer bits (e.g., 4 bits) than the number of CRC bits specified for a corresponding field by the legacy communication protocol, according to an embodiment. According to the detection scheme 1100, the client station, when receiving a data unit, decodes the SIGA field of the data unit. The client station then excludes CRC bits and BCC tail bits from the decoded SIGA field to generate a set of bits based on which CRC for the SIGA field should be generated. Then, a first CRC for the received SIGA field is generated (bock 1102) based on the set of bits and using the CRC generation scheme specified in the first communication protocol. In the embodiment of FIG. 11, CRC according to the field communication protocol is generated using a CRC polynomial specified for the corresponding field by the legacy communication protocol, selecting a subset of bits of the generated CRC (e.g., four LSBs, four MSBs, another suitable subset of CRC bits, etc.) to be utilized for the first CRC, and encrypting one or more bits in the selected subset to generate the first CRC. A second CRC for the SIGA field is generated (bock 1104) based on the set of bits and according to the CRC generation scheme specified in the IEEE 802.11ac Standard and using four LSB or four MSB of the generated CRC as the second CRC. The first generated CRC and the second generated CRC are compared (bock 1106) to the corresponding bits of the CRC that was received in the SIGA field of the data unit. When a match is detected between the received CRC and the first generated CRC, it is determined that the data unit conforms to the first communication protocol, in an embodiment. On the other hand, when a match is detected between the received CRC and the second generated CRC, it is determined that the data unit conforms to the legacy communication protocol (e.g., the IEEE 802.11ac Standard), in an embodiment.

In some embodiments, in addition to or instead of using CRC to intentionally cause a legacy station to detect an error from the UHT-SIGA field 708, one or more subfields of the UHT-SIGA field 708 are set to indicate a mode that is not supported by legacy client stations configured to operate according to the legacy communication protocol to intentionally cause a legacy station to detect an error from the UHT-SIGA field 708. For example, the UHT-SIGA field 708 includes an indication of a modulation and coding scheme not supported by a legacy client station operating according to the IEEE 802.11ac Standard to intentionally cause the legacy client station to detect an error when decoding the UHT-SIGA field 708, and an embodiment. As another example, in some embodiments, the UHT-SIGA field 708 includes subfield combination that is not supported or "unallowable" according to the IEEE 802.11ac Standard. For example, for a single user data unit, the Group ID subfield of the UHT-SIGA field 708 is set to a value of 0 or 63 and the SU MCS field 902-5*b* is set to indicate an MCS greater than 9, in an embodiment. As another example, in another embodiment, the STBC subfield 902-3 and the SU NSTS subfield 902-5*a* are both set to a logic one (1). As yet another example, in yet another embodiment, for a multi-user data unit, the STBC subfield 902-3 and each of Nsts subfields 902-5*c* through 902-5*f* is set to a logic one (1). In other embodiments, other SIGA subfield combinations unallowable in the IEEE 802.11ac Standard are utilized in the UHT-SIGA field 708 to intentionally cause an error when the UHT-SIG field 708 is decoded by a legacy client station. Further, such unallowable combinations included in the UHT-SIGA field 708 of the data unit 700 indicate to a client station that conforms to the first communication protocol that the data unit 700 conforms to the first communication protocol, in some embodiments.

In some embodiments, one or more additional indications is/are included in the UHT-SIGA field 708 of the data unit 700 to indicate to a client station configured to operate according to the first communication protocol that the data unit 700 conforms to the first communication protocol. For example, a subfield that corresponds to a reserved subfield in a VHT-SIGA field generated according to the IEEE 802.11ac Standard is set to a logic zero (0) in the UHT-SIGA field 708 to indicate to a client station configured to operate according to the first communication protocol that the data unit 700 conforms to the first communication protocol. In this embodiment, a client station operating according to the first communication protocol, when receiving a data unit, determines that the data unit conforms to the first communication protocol if the reserved bit in the UHT-SIGA field is set of logic zero (0) and determines that the data unit conforms to the IEEE 802.11ac Standard if the reserved bit is set to a logic one (1), in an embodiment.

In some embodiments, at least some portions (e.g., subfields) of a UHT-SIGA field (e.g., the UHT-SIGA field 708) that are not used to intentionally cause an error at a legacy device are not formatted the same as the corresponding portions (e.g., subfields) of a VHT-SIGA field specified by the IEEE 802.11ac Standard. For example, such portions are altered to include additional information relevant to the first communication protocol, in some embodiments. For example, whereas the VHT-SIGA field specified by the IEEE 802.11ac Standard includes two bits to indicate the BW of a data unit, some data units that conform, to the first communication protocol occupy wider bandwidth than the widest bandwidth specified by the IEEE 802.11ac Standard. Thus, in some embodiments, one or more extra bits are needed to signal the bandwidth for data units that conform to the first communication protocol. For example, in one embodiment, the UHT-SIGA field includes a 3-bit bandwidth indication. Additionally or alternatively, in some embodiments, extra signal field bits are utilized for the UHT-SIGA field to signal new physical layer (PHY) features that are not present in the IEEE 802.11ac Standard.

In some such embodiments, VHT-SIGA subfields that are reserved according to the IEEE 802.11ac Standard are utilized in the UHT-SIGA field to signal the wider bandwidth and/or additional PHY features according to the first communication protocol. Additionally or alternatively, in some embodiments in which UHT-SIGA utilizes a shorter than the eight bit CRC defined for VHT-SIGA in the IEEE 802.11ac Standard, bits corresponding to the remaining CRC bits of the VHT-SIGA field are utilized in the UHT- SIGA field to signal the wider bandwidth and/or additional PHY features according to the first communication protocol.

In some embodiments in which the UHT-SIGA field 708 includes an explicit indication to signal that the data unit 700 conforms to the first communication protocol, schemes designed to intentionally cause an error at a legacy client station are not employed for the UHT-SIGA field 708. For example, in an embodiment, CRC for the UHT-SIGA field 708 is generated using the VHT-SIGA CRC polynomial specified in the IEEE 802.11ac Standard and with the same number of bits as specified in the IEEE 802.11ac Standard. Further, in this embodiment, a subfield that corresponds to a reserved subfield in a VHT-SIGA field generated according to the IEEE 802.11ac Standard is set to a logic zero (0) in the UHT-SIGA field 708 to indicate to a client station configured to operate according to the first communication protocol that the data unit 700 conforms to the first communication protocol. In this case, a client station configured to operate according to the first communication protocol will determine that the data unit 700 conforms to the first communication protocol based on the indication included in the UHT-SIGA field 708. However, a legacy client station client station receiving the data unit 700, in this case, will not necessary detect an error from the UHT-SIGA field 708 and will not necessarily drop the data unit 700. In some situations, in such embodiments, the legacy client station will drop the data unit 700 even without detecting an intentionally caused error from the UHT-SIGA field 708. For example, the legacy client station will determine that the partial address identification (PAID) and/or the group ID (GID) included in the UHT-SIGA field 708 do not match the corresponding parameters of the client station, and will drop (stop decoding) the data unit 700 based on this determination. In other embodiments, however, the legacy client station will not drop the data unit 700 even when the client station determines that the partial address identification (PAID) and/or the group ID (GID) included in the UHT-SIGA field 708 do not match the corresponding parameters of the client station. In this case, the client station will continue decoding the data unit 700 for the duration of the data unit 700, and will discard the data unit 700 based on a failed FCS check at the end of the data unit 700, in at least some situations.

In another embodiment, CRC for the UHT-SIGA field 708 is generated using the VHT-SIGA CRC polynomial specified in the IEEE 802.11ac Standard, but with fewer bits than specified in the IEEE 802.11ac Standard. For example, a CRC is generated using the VHT-SIGA CRC polynomial and x number of the generated CRC is/are used as the CRC for the UHT-SIGA field 708. For example, four (or another suitable number, such as e.g., 5 or 6) MSB or LSB of the CRC generated using the VHT-SIGA CRC polynomial are utilized, in some embodiments. In some such embodiments, the remaining bit locations of the CRC subfield are reserved or are utilized to signal additional information relevant to the first communication protocol. In such embodiments, although CRC is not intentionally designed to cause an error from the UHT-SIGA field at a legacy client device, it is highly likely that such an error will be detected, in which case the client station will drop the data unit 700. Further, in such embodiments, a client station configured to operate according to the first communication protocol will perform a CRC check for the UHT-SIGA field 708 by generating CRC based on received bits of the UHT-SIGA field 708 using the CRC polynomial specified for the VHT-SIGA field in the IEEE 802.11ac Standard and comparing 4 (or another suitable number, such as e.g., 5 or 6) MSB or LSB of the generated CRC to the received CRC in the UHT-SIGA field.

Upon passing the CRC check, the client station will decode the received UHT-SIGA field and will determine that the data unit 700 conforms to the first communication protocol based on the indication included in the UHT-SIGA field.

Figure 12:
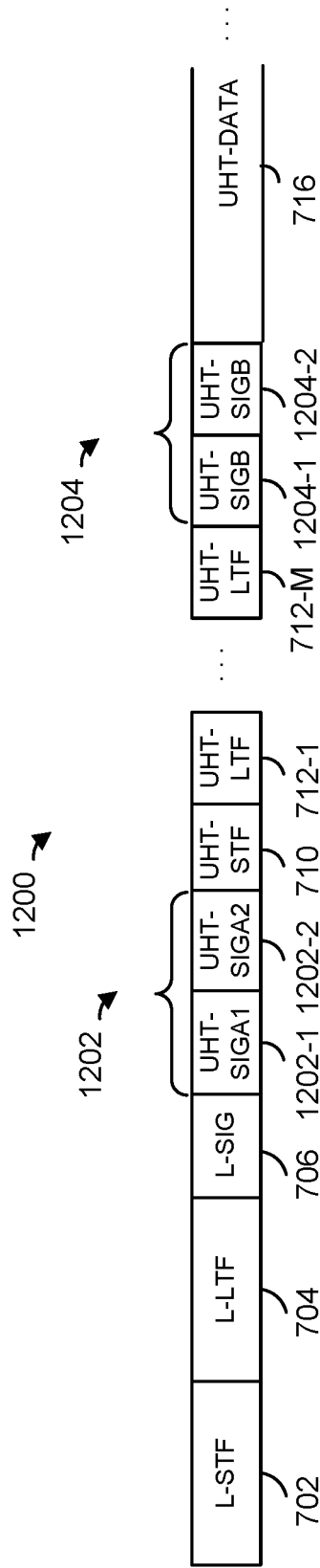
FIG. 12 is a block diagram depicting yet another detection scheme for detecting whether a data unit conforms to a first communication protocol or to a second communication protocol, according to an embodiment.

FIG. 12 is a diagram of an OFDM data unit 1200 that the client station AP 14 is configured to transmit to the client station 25-1 via orthogonal frequency domain multiplexing (OFDM) modulation, according to an embodiment. In an embodiment, the client station 25-1 is also configured to transmit the data unit 1200 to the AP 14. The data unit 1200 conforms to the first communication protocol and occupies a 20 MHz bandwidth. Data units similar to the data unit 1200 occupy other suitable bandwidth such as 40 MHz, 80 MHz, 160 MHz, 320 MHz, 640 MHz, for example, or other suitable bandwidths, in other embodiments. The data unit 1200 is suitable for "mixed mode" situations, i.e. when the WLAN 10 includes a client station (e.g., the legacy client station 24-4) that conforms to a legacy communication protocol, but not the first communication protocol. The data unit 1200 is utilized in other situations as well, in some embodiments.

The data unit 1200 is similar to the data unit 700 of FIG. 7A, except that the data unit 1200 includes two UHT-SIGB fields 1204 as compared to a single UHT-SIG field 714 included in the data unit 700. Further, UHT-SIGA fields 1202 are different from the UHT-SIGA fields 708 of the data unit 700, in some embodiments. For example, one or more information bits of the UHT-SIGA fields 708 are moved from the UHT-SIGA fields 1202 to the UHT-SIGB fields 1204, on an embodiment. For example, one or more information bits that are not required for determining appropriate processing of the UHT-LTFs 712 are moved to the UHT-SIGB fields 1204, in some embodiments. Various UHT-SIGA generation schemes used to intentionally cause a legacy client station to detect an error from the UHT-SIGA and/or to indicate to a client station configured to operate according to the first communication protocol that the data unit 700 conforms to the first communication protocol are applied to the UHT-SIGA fields 1202, in at least some embodiments.

Figure 13A:
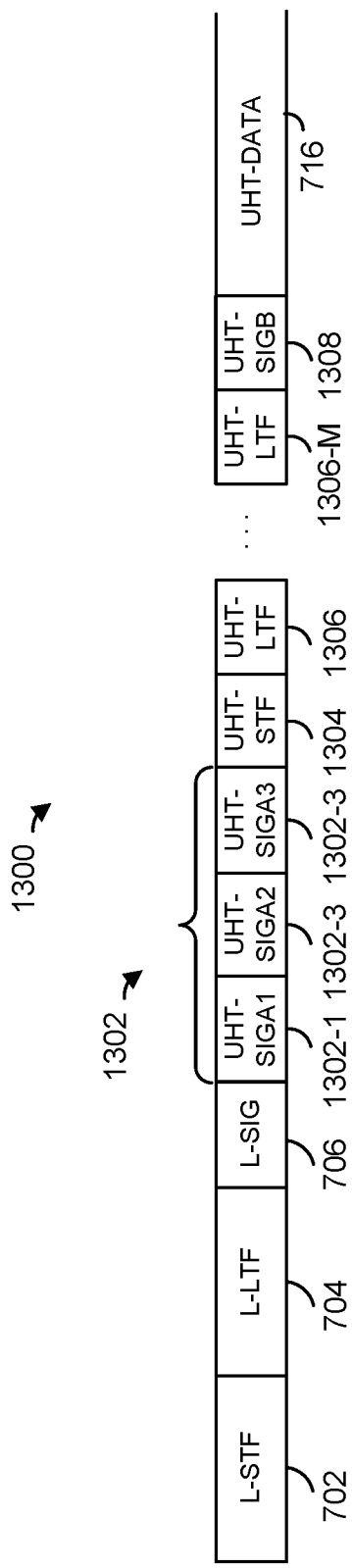
FIG. 13A is a diagram of an example data unit format, according to an embodiment.

FIG. 13A is a diagram of an OFDM data unit 1300 that the client station AP 14 is configured to transmit to the client station 25-1 via orthogonal frequency domain multiplexing (OFDM) modulation, according to an embodiment. In an embodiment, the client station 25-1 is also configured to transmit the data unit 1300 to the AP 14. The data unit 1300 conforms to the first communication protocol and occupies a 20 MHz bandwidth. Data units similar to the data unit 1300 occupy other suitable bandwidth such as 40 MHz, 80 MHz, 160 MHz, 320 MHz, 640 MHz, or other suitable bandwidths, in other embodiments. The data unit 1300 is suitable for "mixed mode" situations, i.e. when the WLAN 10 includes a client station (e.g., the legacy client station 24-4) that conforms to a legacy communication protocol, but not the first communication protocol. The data unit 1300 is utilized in other situations as well, in some embodiments.

The data unit 1300 is similar to the data unit 700 of FIG. 7A, except that the data unit 1200 includes three UHT-SIGA fields 1302 as compared to two UHT-SIGA field 708 included in the data unit 700. In some embodiments, data unit similar to the data unit 1300 include other suitable numbers (e.g., 4, 5, 6, etc.) of the UHT-SIGA fields 1302. Each UHT-SIGA field 1302 comprises one OFDM symbol of the data unit 1300, in an embodiment. Additional UHT-SIGA fields 1320 as compared to the two UHT-SIGA fields 708 of the data unit 700 are utilized to carry additional information relevant to the first communication protocol, for example to signal wider bandwidths defined in the first communication protocol, or to signal additional PHY features included in the first communication protocol. In some embodiments, UHT-SIGB field 1308 is omitted from the data unit 1300, and at least some of the Information included in the UHT-SIGB field 1308 (e.g., MU information) is moved to the UHT-SIGA fields 1302, in some such embodiments.

Figure 13B:
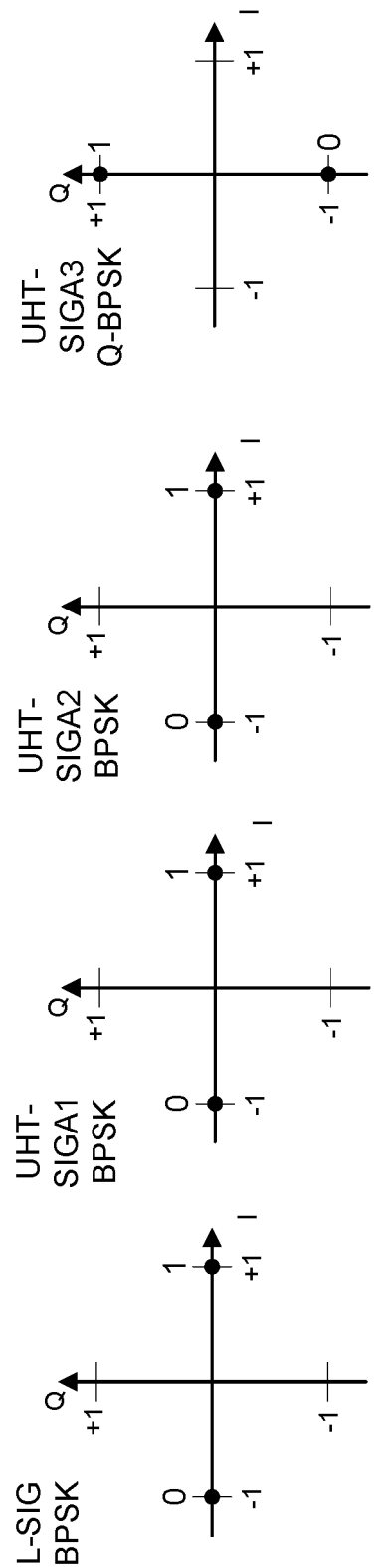
FIG. 13B illustrates diagrams of modulation used to modulate symbols in the data unit depicted in FIG. 13A, according to an embodiment.

FIG. 13B is a set of diagrams illustrating modulation of the L-SIG 706, UHT-SIGA1 1302-1, and UHT-SIGA2 1302-2, and UHT-SIGA2 1302-2 of the data unit 1300 of FIG. 13A, according to an embodiment. In this embodiment, the L-SIG 706, the UHT-SIGA1 1302-1, and the UHT-SIGA2 1302-2 fields are modulated according to BPSK modulation, signaling to legacy client stations configured to operate to the IEEE 802.11a Standard and/or the IEEE 802.11n Standard that the data unit 1300 conforms to the IEEE 802.11a Standard. Accordingly, legacy client stations configured to operate to the IEEE 802.11a Standard, the IEEE 802.11n Standard and/or the IEEE 802.11ac will process the data unit 1300 in the same manner that such devices would treat an IEEE 802.11a packet, in at least some embodiments and/or scenarios. For example, a legacy client station will compute, based on the L-SIG field 706, a packet duration for the data unit 1300, and will wait until the end of the computed packet duration before performing clear channel assessment (CCA), in an embodiment. Further, a client station configured to operate according to the first communication protocol will detect the modulation of the UHT-SIGA3 field 1302-3 (e.g., Q-BPSK) and, based on the detected modulation, will determined that the data unit 1300 conforms to the first communication protocol, in an embodiment.

Figure 14A:
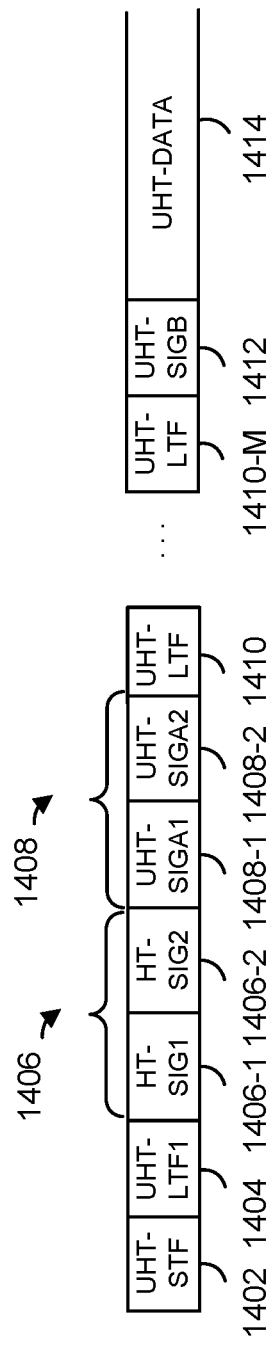
FIG. 14A is a diagram of an example data unit format, according to an embodiment

FIG. 14A is a diagram of an OFDM data unit 1400 that the client station AP 14 is configured to transmit to the client station 25-1 via orthogonal frequency domain multiplexing (OFDM) modulation, according to an embodiment. In an embodiment, the client station 25-1 is also configured to transmit the data unit 1400 to the AP 14. The data unit 1400 conforms to the first communication protocol and occupies a 20 MHz bandwidth. Data units similar to the data unit 1400 occupy other suitable bandwidth such as 40 MHz, 80 MHz, 160 MHz, 320 MHz, 640 MHz, or other suitable bandwidths, in other embodiments. The data unit 1400 is suitable for situations in which the WLAN 10 does not include any client stations configured to operate to the IEEE 802.11a Standard but not the IEEE 802.11n Standard, in some embodiments.

The data unit 1400 includes a preamble having an ultra high throughput short training field (UHT-STF) 1402, a first ultra high throughput long training field (UHT-LTF) 1404, two legacy high throughput signal fields (HT-SIGs) 1406 including a first high throughput signal field (HT-SIG1) 1406-1 and a second high throughput signal field (HT-SIG2) 1406-2, two ultra high throughput signal fields (UHT-SIGs) 1408 including a first ultra high throughput signal field (UHT-SIG1) 1408-1 and a second ultra high throughput signal field (UHT-SIG2) 1408-2, M ultra high throughput long training fields (UHT-LTFs) 1410, where M is an integer, and a third ultra high throughput signal field (UHT-SIGB) 714. In an embodiment, the UHT-SIGAs 1408 comprise two OFDM symbols, where the UHT-SIGA1 1408-1 field comprises the first OFDM symbol and the UHT-SIGA2 1408-2 comprises the second OFDM symbol. In at least some examples, the UHT-SIGAs 1408 are collectively referred to as a single very high throughput signal field (UHT-SIGA) 1408. In some embodiments, the data unit 1400 also includes a data portion 1414. In other embodiments, the data unit 1400 omits the data portion 1414.

In the embodiment of FIG. 1400A, the data unit 1400 includes one of each of the UHT-STF 1402, the UHT-LTF1 1403, the HT-SIG 1406 and the UHT-SIGA 1408. In other embodiments in which an OFDM data unit similar to the data unit 1400 occupies a cumulative bandwidth other than 20 MHz, each of the UHT-STF 1402, the UHT-LTF1 1403, the HT-SIG 1406 and the UHT-SIGA 1408 is repeated over a corresponding number of 20 MHz sub-bands of the whole bandwidth of the data unit, in an embodiment. For example, in an embodiment, the OFDM data unit occupies an 80 MHz bandwidth and, accordingly, includes four of each of the UHT-STF 1402, the UHT-LTF1 1403, the HT-SIG 1406 and the UHT-SIGA 1408. In some embodiments, the modulation of different 20 MHz sub-bands signals is rotated by different angles. For example, in one embodiment, a first subband is rotated 0-degrees, a second subband is rotated 90-degrees, a third sub-band is rotated 180-degrees, and a fourth sub-band is rotated 270-degrees. In other embodiments, different suitable rotations are utilized. The different phases of the 20 MHz sub-band signals result in reduced peak to average power ratio (PAPR) of OFDM symbols in the data unit 700, in at least some embodiments.

Further, if the data unit conforming to the first communication protocol is an OFDM data unit that occupies a cumulative bandwidth such as 20 MHz, 40 MHz, 80 MHz, 160 MHz, 320 MHz, 640 MHz, etc., UHT-LTFs 1410, the UHT-SIGB 1412 and the UHT data portion 1414 occupy the corresponding whole bandwidth of the data unit, according to an embodiment. Further, in an embodiment, each of the UHT-STF 1402, the UHT-LTF1 1403, the HT-SIG 1406 and the UHT-SIGA 1408 are single stream fields mapped to multiple spatial streams of the data unit 1400 using a column (e.g., the first column) or a row (e.g., the first row) of a spatial stream mapping matrix ("P matrix") used for mapping multi-stream portion of the data unit 1400 e.g., the UHT-LTFs 1410, the UHT-SIGB 1412 and the UHT data portion 1414) to multiple spatial streams.

In some embodiments, data units similar to the data unit 1300 include other suitable numbers (e.g., 4, 5, 6, etc.) of the UHT-SIGA fields 1408. Each UHT-SIGA field 1408 comprises one OFDM symbol, in an embodiment. Additional UHT-SIGA fields 1408 are utilized to carry additional information relevant to the first communication protocol, for example to signal wider bandwidths defined in the first communication protocol, or to signal additional PHY features included in the first communication protocol, in some embodiments. Further, the UHT-SIGB field 1412 is omitted from the data unit 1400, and at least some of the information included in the UHT-SIGB field 1412 (e.g., MU information) is moved to the UHT-SIGA fields 1406, in some such embodiments.

Figure 14B:
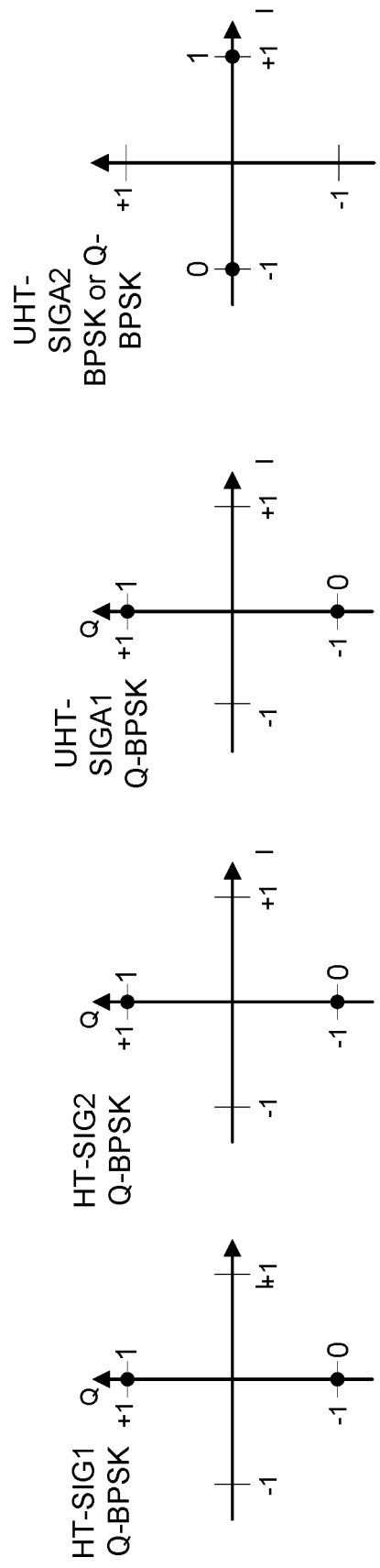
FIG. 14B illustrates diagrams of modulation used to modulate symbols in the data unit depicted in FIG. 14A, according to an embodiment.

FIG. 14B is a set of diagrams illustrating modulation of HT-SIG1 1406-1, UHT-SIGA2 1406-2, and UHT-SIGA1 1408-1 and UHT-SIGA2 1408-2 of the data unit 1400 of FIG. 14A, according to an embodiment. In the illustrated embodiment, HT-SIG1 1406-1, UHT-SIGA2 1406-2, and UHT-SIGA1 1408-1 are modulated using Q-BPSK modulation. In an embodiment, legacy client stations configured to operate to the IEEE 802.11n Standard and/or the IEEE 802.11ac Standard detect Q-BPSK modulation of the HT-SIG1 1406-1, UHT-SIGA2 1406-2, and UHT-SIGA1 1408-1 and, based on the detected modulation, will process the data unit 1400 as the legacy client station would process an IEEE 802.11n greenfield packet. In such embodiments, the legacy client station will calculate a duration based on a rate and a length (e.g., in number of bytes) indicated in the HT-SIG field 1406 of the data unit 1400. In an embodiment, the rate and the length in the HT-SIG field 1406 are set such that a client station configured to operate according to a legacy communication protocol will calculate, based on the rate and the length, a packet duration (T) that corresponds to, or at least approximates, the actual duration of the data unit 1400. For example, the rate is set to indicate a lowest rate defined by the IEEE 802.11n Standard (i.e., 6 Mbps), and the length is set to a value computed such that packet duration computed using the lowest rate at least approximates the actual duration of the data unit 1400. A legacy client station, when receiving the data unit 1400, will compute a packet duration for the data unit 1400, and will wait until the end of the computed packet duration before performing clear channel assessment (CCA), in an embodiment. Further, a client station configured to operate according to the first communication protocol will detect the modulation of the UHT-SIGA2 field 1408-2 (e.g., Q-BPSK) of the data unit 1400 and will determine that the data unit 1400 conforms to the first communication protocol, according to an embodiment.

Figure 15:
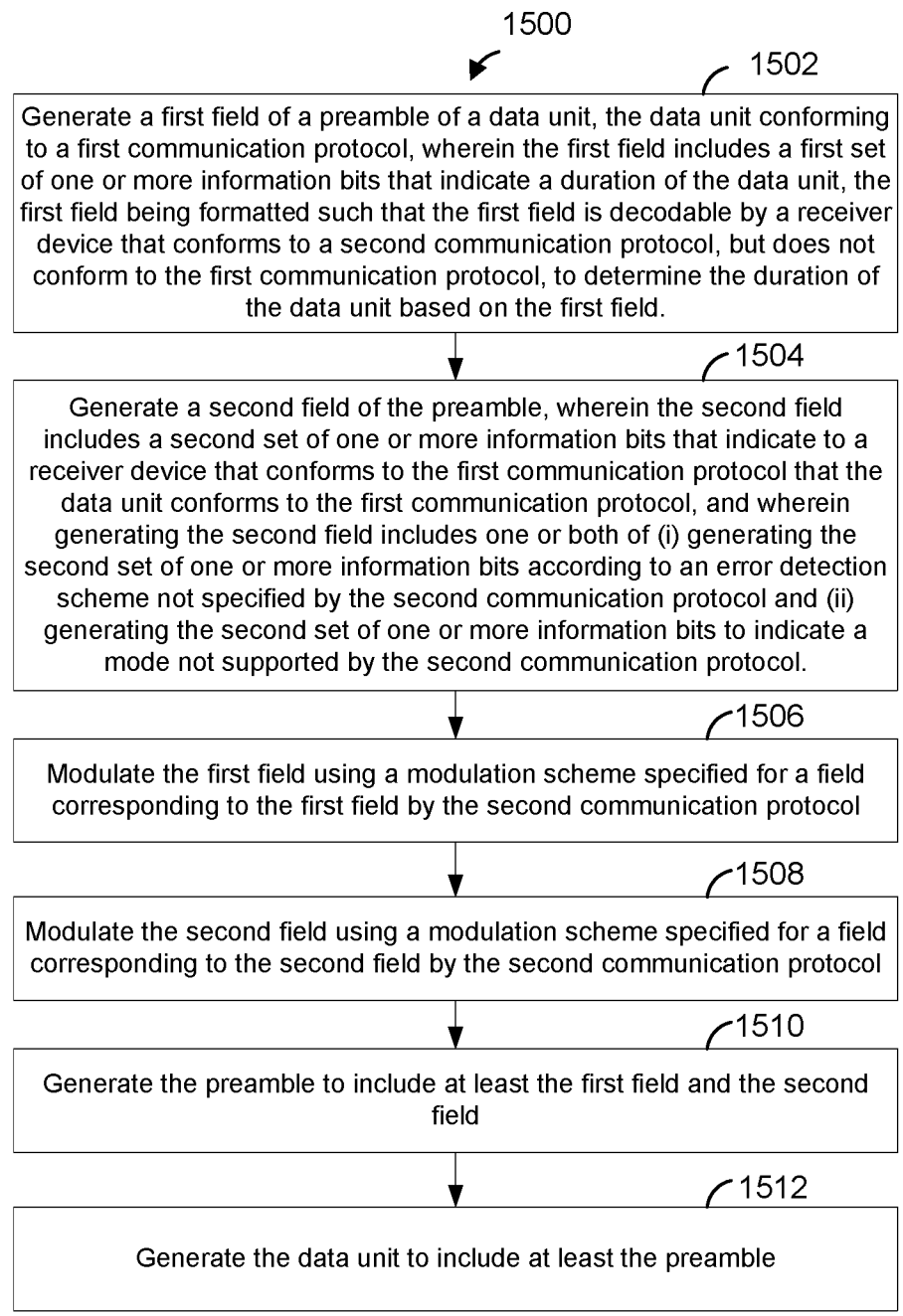
FIG. 15 is a diagram of a method for generating a data unit, according to an embodiment.

FIG. 15 is a flow diagram of an example method 1500 for generating a data unit, according to an embodiment. With reference to FIG. 1, the method 1500 is implemented by the network interface 16, in an embodiment. For example, in one such embodiment, the PHY processing unit 20 is configured to implement the method 1500. According to another embodiment, the MAC processing 18 is also configured to implement at least a part of the method 1500. With continued reference to FIG. 1, in yet another embodiment, the method 1500 is implemented by the network interface 27 (e.g., the PHY processing unit 29 and/or the MAC processing unit 28). In other embodiments, the method 1500 is implemented by other suitable network interfaces.

At block 1502, a first field of a preamble of a data unit conforming to a first communication protocol is generated. Referring to FIG. 7, in one embodiment, the L-SIG field 706 of the data unit 700 is generated. In another embodiment, another suitable first field is generated. The first field includes a first set of one or more information bits that indicate a duration of the data unit. The first field is formatted such that the first field decodable by a receiver device that conforms to a second communication protocol, but does not conform to the first communication protocol, to determine the duration of the data unit based on the first field. The first set of information bits corresponds, for example, to a rate subfield and a length subfield of the preamble of the data unit, wherein the rate subfield and the length subfield are generated to allow the receiver device that conforms to the second communication protocol to compute at least an approximate duration of the data unit, in an embodiment. In another embodiment, the first set of information bits indicate other suitable information to allow a receiver device that conforms to the second communication protocol to determine a duration of the data unit.

In an embodiment, the first communication protocol is the UHT communication protocol and the second communication protocol is a legacy communication protocol such as the IEEE 802.11ac Standard. In other embodiments, the first communication protocol and/or the second communication protocol is another suitable communication protocol, including communication protocol not yet defined. For example, the second communication protocol is the UHT communication protocol, and the first communication protocol is a communication protocol defining even higher throughputs, in some embodiments.

At block 1504, a second field of the preamble is generated. Referring to FIG. 7, in one embodiment, the UHT-SIGA field 708 of the data unit 700 is generated. In another embodiment, another suitable second field is generated. The second field includes a second set of one or more information bits that indicate to a receiver device that conforms to the first communication protocol that the data unit conforms to the first communication protocol. The second set of one or more information is generated according to an error detection scheme, such as a cyclic redundancy check (CRC) scheme, not specified by the second communication protocol, in an embodiment. For example, the second set of information bits is generated according to the CRC generation scheme 950 of FIG. 9A, the CRC generation scheme 960 of FIG. 9B or the CRC generation scheme 970 of FIG. 9C, in some example embodiments. In other embodiments, the second set of one or more information bits is generated according to other suitable error detection schemes not specified by the second commutation protocol. Additionally or alternatively, the second set of one or more information bits is generated to indicate a mode no supported by the second communication protocol, such as a GID and MCS combination, or another suitable mode, not supported by the second communication protocol.

At block 1506, the first field generated at block 1502 is modulation according to a modulation scheme specified for a field corresponding to the first field by the second communication protocol. For example, the first field is modulating using BPSK modulation, in an embodiment. In another embodiment, the first field is modulated using another suitable modulation scheme, such as Q-BPSK modulation or another suitable modulation specified for a field corresponding to the first field by the second communication protocol.

At block 1508, the second field generated at block 1502 is modulation according to a modulation scheme specified for a field corresponding to the second field by the second communication protocol. For example, the second field comprises two OFDM symbols, wherein the first OFDM symbol is modulated using Q-BPSK modulation at block 1508 and the second OFDM symbol is modulation using BPSK modulation as specified by the second communication protocol, in one embodiment. In other embodiments, the second field is modulated at block 1508 using other suitable modulation schemes specified for a field corresponding to the second field by the second communication protocol.

At block 1510, the preamble of the data unit is generated to include at least the first field and the second field. At block 1512, the data unit is generated to include at least the preamble generated at block 1510. In some embodiments, the data unit is generated to further include a data portion. When the data unit is generated to include a data portion, the data portion is generated such that the data portion conforms to the first communication protocol, but does not conform to the second communication protocol, in some embodiments.

Figure 16:
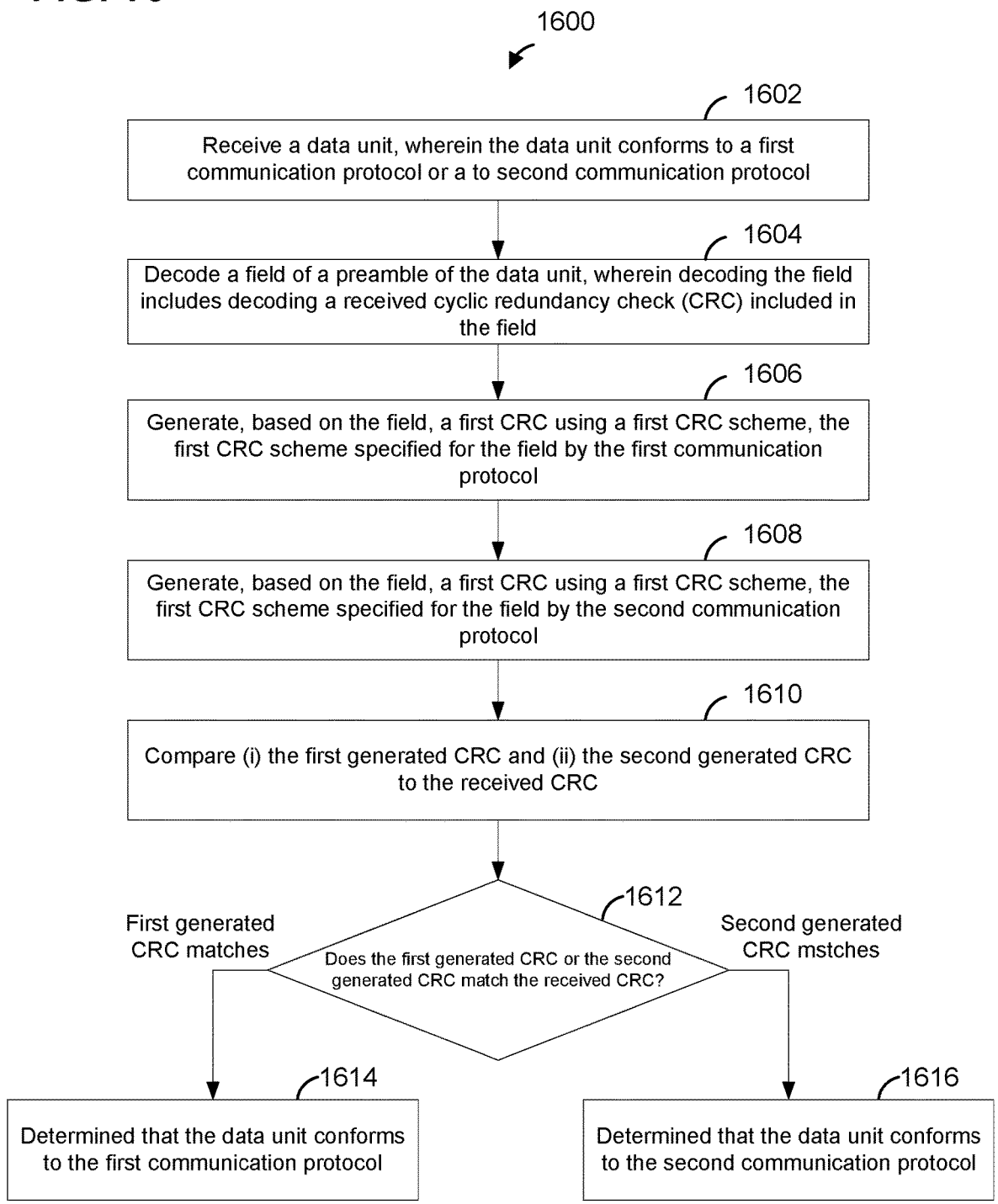
FIG. 16 is a diagram of a method for detecting whether a data unit conforms to a first communication protocol or to a second communication protocol, according to an embodiment.

FIG. 16 is a flow diagram of an example method 1600, according to an embodiment. With reference to FIG. 1, the method 1600 is implemented by the network interface 16, in an embodiment. For example, in one such embodiment, the PHY processing unit 20 is configured to implement the method 1600. According to another embodiment, the MAC processing 18 is also configured to implement at least a part of the method 1600. With continued reference to FIG. 1, in yet another embodiment, the method 1600 is implemented by the network interface 27 (e.g., the PHY processing unit 29 and/or the MAC processing unit 28). In other embodiments, the method 1600 is implemented by other suitable network interfaces.

At block 1602, a data unit that conforms to a first communication protocol or to a second communication protocol is received. In an embodiment, the data unit is received by a receiver device via a communication channel. In an embodiment, the data unit 700 of FIG. 7 is received. In another embodiment, the data unit 500 of FIG. 5 is received. In another embodiment, another suitable data unit is received. In an embodiment, the first communication protocol is the UHT communication protocol and the second communication protocol is a legacy communication protocol such as the IEEE 802.11ac Standard. In other embodiments, the first communication protocol and/or the second communication protocol is another suitable communication protocol, including communication protocol not yet defined. For example, the second communication protocol is the UHT communication protocol, and the first communication protocol is a communication protocol defining even higher throughputs, in some embodiments.

At block 1604, a field of a preamble of the data unit received at block 1602 is decoded. Referring to FIG. 7, in an embodiment, the UHT-SIGA field 708 of the data unit 700 is decoded. Referring to FIG. 5, the VHT-SIGA field 508 is decoded, in another embodiment. In another embodiment, another suitable field of a preamble of the data unit received at block 1602 is decoded. In an embodiment, decoding the field at block 1604 included decoding a received CRC included in the field decoded at block 1604.

At block 1606, a first CRC is generated based on the field decoded at block 1604. The first CRC is generated using a first CRC generation scheme, the first CRC generation scheme specified for the field by the first communication protocol. For example, the first CRC is generated according to the CRC generation scheme 950 of FIG. 9A, the CRC generation scheme 960 of FIG. 9B or the CRC generation scheme 970 of FIG. 9C, in some example embodiments. In other embodiments, the first CRC is generated according to other suitable CRC generation schemes specified for the field by the first communication protocol.

At block 1608, a second CRC is generated based on the field decoded at block 1604. The second CRC is generated using a second CRC generation scheme, the second CRC generation scheme specified for the field by the second communication protocol. For example, the second CRC is generated according to the CRC generation scheme specified for the VHT-SIGA field in the IEEE 802.11ac Standard, in one embodiment. In other embodiments, the second CRC is generated according to other suitable schemes specified for the field by the second communication protocol.

At block 1610, the first CRC generated at block 1606 and the second CRC generated at block 1608 are compared to the received CRC decoded at block 1604. At block 1612, it is determined whether the first generated CRC or the second generated CRC matches the received CRC. When it is determined at block 1612 that the first generated CRC matches the received CRC, the method continues at block 1614, where it is determined that the data unit received at block 1602 conforms to the first communication protocol. On the other hand, when it is determined at block 1612 that the second generated CRC matches the received CRC, the method continues at block 1616, where it is determined that the data unit received at block 1602 conforms to the second communication protocol.

Figure 17:
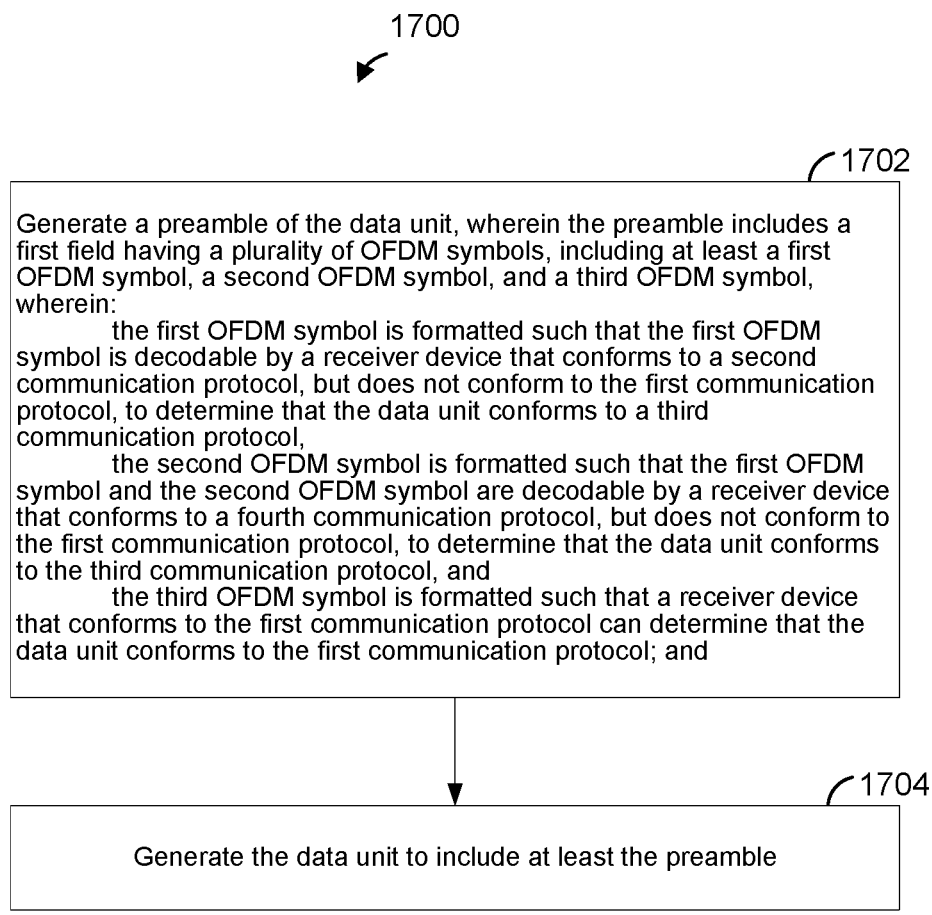
FIG. 17 is a diagram of a method for generating a data unit, according to an embodiment.

FIG. 17 is a flow diagram of an example method 1700 for generating a data unit that conforms to a first communication protocol, according to an embodiment. With reference to FIG. 1, the method 1700 is implemented by the network interface 16, in an embodiment. For example, in one such embodiment, the PHY processing unit 20 is configured to implement the method 1700. According to another embodiment, the MAC processing 18 is also configured to implement at least a part of the method 1700. With continued reference to FIG. 1, in yet another embodiment, the method 1700 is implemented by the network interface 27 (e.g., the PHY processing unit 29 and/or the MAC processing unit 28). In other embodiments, the method 1700 is implemented by other suitable network interfaces.

At block 1702, a preamble of the data unit is generated. In an embodiment, the preamble of the data unit 1300 in FIG. 13 is generated. In another embodiment, another suitable preamble is generated. The preamble includes a first field having a plurality of OFDM symbols. In an embodiment, the first field is the signal field 1302 in FIG. 13. In another embodiment, the first field is another suitable first field. The first field includes at least a first OFDM symbol, a second OFDM symbol, and a third OFDM symbol.

The first OFDM symbol is formatted such that the first OFDM symbol is decodable by a receiver device that conforms to a second communication protocol, but does not conform to the first communication protocol, to determine that the data unit conforms to a third communication protocol. The first OFDM symbol is formatted, for example, as the UHT-SIGA1 1302-1 of FIG. 13, in an embodiment. In this embodiment, the first OFDM symbol is modulated according to BPSK modulation. In an embodiment, BPSK modulation of the first OFDM symbol causes a device that conforms to the second communication protocol (e.g., a legacy client station that conforms to the IEEE 802.11n Standard), to determine that the data unit conforms a third communication protocol (e.g., the IEEE 802.11a Standard).

The second OFDM symbol is formatted such that the second OFDM symbol and the first OFDM symbol are decodable by a receiver device that conforms to a fourth communication protocol, but does not conform to the first communication protocol, to determine that the data unit conforms to the third communication protocol. The second OFDM symbol is formatted, for example, as the UHT-SIGA2 1302-2 of FIG. 13, in an embodiment. In this embodiment, the second OFDM symbol is modulated according to BPSK modulation. In an embodiment, BPSK modulation of the first OFDM symbol, in combination with BPSK modulation of the first OFDM symbol, causes a device that conforms to the fourth communication protocol (e.g., a legacy client station that conforms to the IEEE 802.11ac Standard), to determine that the data unit conforms the third communication protocol (e.g., the IEEE 802.11a Standard).

The third OFDM symbol is formatted such a receiver device that conforms to the first communication protocol can determine that the data unit conforms to the first communication protocol. The third OFDM symbol is formatted, for example, as the UHT-SIGA3 1302-3 of FIG. 13, in an embodiment. In this embodiment, the third OFDM symbol is modulated according to Q-BPSK modulation. In an embodiment, Q-BPSK modulation of the third OFDM symbol causes a device that conforms to the first communication protocol (e.g., the UHT communication protocol), to determine that the data unit conforms the first communication protocol.

At block 1704, the data unit is generated to include at least the preamble. In an embodiment, the data unit 1300 of FIG. 13 is generated. In an embodiment, the data unit 1300 is generated, wherein the data unit 1300 omits the data portion 716. In another embodiment, the data unit 1300 is generated, wherein the data unit 1300 includes the data portion 716. In other embodiments, other suitable data units are generated. When the data unit is generated to include a data portion, the data portion is generated such that the data portion conforms to the first communication protocol, and does not conform to either of the second communication protocol, the third communication protocol, and the fourth communication protocol, in some embodiments.

At least some of the various blocks, operations, and techniques described above may be implemented utilizing hardware, a processor executing firmware instructions, a processor executing software instructions, or any combination thereof. When implemented utilizing a processor executing software or firmware instructions, the software or firmware instructions may be stored in any computer readable memory such as on a magnetic disk, an optical disk, or other storage medium, in a RAM or ROM or flash memory, processor, hard disk drive, optical disk drive, tape drive, etc. Likewise, the software or firmware instructions may be delivered to a user or a system via any known or desired delivery method including, for example, on a computer readable disk or other transportable computer storage mechanism or via communication media. Communication media typically embodies computer readable instructions, data structures, program modules or other data in a modulated data signal such as a carrier wave or other transport mechanism. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, radio frequency, infrared and other wireless media. Thus, the software or firmware instructions may be delivered to a user or a system via a communication channel such as a telephone line, a DSL line, a cable television line, a fiber optics line, a wireless communication channel, the Internet, etc. (which are viewed as being the same as or interchangeable with providing such software via a transportable storage medium). The software or firmware instructions may include machine readable instructions that, when executed by the processor, cause the processor to perform various acts.

When implemented in hardware, the hardware may comprise one or more of discrete components, an integrated circuit, an application-specific integrated circuit (ASIC), etc.

While the present invention has been described with reference to specific examples, which are intended to be illustrative only and not to be limiting of the invention, changes, additions and/or deletions may be made to the disclosed embodiments without departing from the scope of the invention.

What is claimed is:

1. A method for generating a physical layer (PHY) protocol data unit for transmission via a communication channel, the PHY protocol data unit conforming to a first communication protocol, the method comprising:
   generating, at a network interface device, a PHY preamble of the PHY protocol data unit, wherein the PHY preamble is generated to include:
      a first field that includes a first set of one or more information bits that indicate a duration of the PHY protocol data unit, the first field being formatted such that the first field is decodable by a receiver device that conforms to a second communication protocol, but does not conform to the first communication protocol, to determine the duration of the PHY protocol data unit based on the first field, and
      a second field that includes a second set of one or more information bits that indicate to a receiver device that conforms to the first communication protocol that the data unit conforms to the first communication protocol, and wherein generating the PHY preamble includes one or both of (i) generating the second set of one or more information bits according to an error detection scheme that does not conform to the second communication protocol and (ii) generating the second set of one or more information bits to indicate a PHY mode not supported by the second communication protocol,
   wherein generating the PHY preamble includes modulating the PHY preamble onto a first plurality of orthogonal frequency division multiplexing (OFDM) symbols; and
   generating, at a network interface device, a PHY data portion of the PHY protocol data.

2. The method of claim 1, wherein generating the second set of one or more information bits according to the error detection scheme not specified by the second communication protocol comprises generating a cyclic redundancy check (CRC) for the second field according to a CRC polynomial different than a CRC polynomial specified for a corresponding PHY preamble field by the second communication protocol.

3. The method of claim 1, wherein generating the second set of one or more information bits according to the error detection scheme not specified by the second communication protocol comprises generating a cyclic redundancy check (CRC) for the second field, including:
   generating, at the network interface device, a plurality of CRC bits according to a CRC polynomial specified for a corresponding PHY preamble field by the second communication protocol, and
   encrypting, at the network interface device, one or more bits of the plurality of CRC bits to generate the CRC for the second field.

4. The method of claim 1, wherein generating the second set of one or more information bits according to the error detection scheme not specified by the second communication protocol comprises generating a cyclic redundancy check (CRC) for the second field, including:
   generating, at the network interface device, a plurality of CRC bits according to a CRC polynomial specified for a corresponding PHY preamble field by the second communication protocol,
   selecting, at the network interface device, a subset of the plurality of CRC bits, the subset to be utilized for the CRC for the second field; and
   encrypting, at the network interface device, one or more bits in the selected subset of the plurality of CRC bits to generate the CRC for the second field.

5. The method of claim 1, wherein the second field includes a modulation and coding (MCS) subfield, and wherein generating the second set of one or more information bits to indicate the PHY mode not supported by the second communication protocol includes generating the MCS subfield to indicate a modulation and coding scheme not supported by the second communication protocol.

6. The method of claim 1, wherein:
   the second field includes i) a first set of bits set to a first value, and ii) a second set of bits set to a second value;

the first set of bits corresponds to a first subfield, specified by the second communication, to indicate a first PHY parameter;

the second set of bits corresponds to a second subfield, specified by the second communication protocol, to indicate a second PHY parameter; and the first value and the second value corresponds to a combination of values of the first PHY parameter and the second PHY parameter not supported by the second communication protocol.

7. The method of claim 1, wherein the second communication protocol conforms to the Institute for Electrical and Electronics Engineers (IEEE) 802.11ac Standard.

8. The method of claim 7, wherein the first communication protocol is a communication protocol that supports a higher throughput than the IEEE 802.11ac Standard.

9. An apparatus comprising:

a network interface device having one or more integrated circuit (IC) devices configured to:

generate a physical layer (PHY) preamble of a PHY protocol data unit, wherein the PHY preamble is generated to include:

a first field that includes a first set of one or more information bits that indicate a duration of the PHY protocol data unit, the first field being formatted such that the first field is decodable by a receiver device that conforms to a second communication protocol, but does not conform to the first communication protocol, to determine the duration of the PHY protocol data unit based on the first field, and a second field that includes a second set of one or more information bits that indicate to a receiver device that conforms to the first communication protocol that the data unit conforms to the first communication protocol, and wherein generating the PHY preamble includes one or both of (i) generating the second set of one or more information bits according to an error detection scheme that does not conform to the second communication protocol and (ii) generating the second set of one or more information bits to indicate a PHY mode not supported by the second communication protocol;

wherein the one or more IC devices are further configured to:

modulate the PHY preamble onto a first plurality of orthogonal frequency division multiplexing (OFDM) symbols, and generate a PHY data portion of the PHY protocol data.

10. The apparatus of claim 9, wherein the one or more integrated circuits are further configured to generate the second set of one or more information bits according to the error detection scheme not specified by the second communication protocol at least by generating a cyclic redundancy check (CRC) for the second field according to a CRC polynomial different than a CRC polynomial specified for a corresponding PHY preamble field by the second communication protocol.

11. The apparatus of claim 9, wherein the one or more integrated circuits are further configured to generate the second set of one or more information bits according to the error detection scheme not specified by the second communication protocol at least by generating a cyclic redundancy check (CRC) for the second field, including:

generating a plurality of CRC bits according to a CRC polynomial specified for a corresponding PHY preamble field by the second communication protocol, and encrypting one or more bits of the plurality of CRC bits to generate the CRC for the second field.

12. The apparatus of claim 9, wherein the one or more integrated circuits are further configured to generate the second set of one or more information bits according to the error detection scheme not specified by the second communication protocol at least by generating a cyclic redundancy check (CRC) for the second field, including:

generating a plurality of CRC bits according to a CRC polynomial specified for a corresponding field by the second communication protocol, selecting a subset of the plurality of CRC, the subset to be utilized for the CRC for the second field; and encrypting one or more bits in the selected subset of the plurality of CRC bits to generate the CRC for the second field.

13. The apparatus of claim 9, wherein the second field includes a modulation and coding (MCS) subfield, and wherein the one or more integrated circuits are further configured to generate the second set of one or more information bits to indicate the mode not supported by the second communication protocol at least by generating the MCS subfield to indicate a modulation and coding scheme not supported by the second communication protocol.

14. The apparatus of claim 9, wherein:

the second field includes i) a first set of bits set to a first value, and ii) a second set of bits set to a second value;

the first set of bits corresponds to a first subfield, specified by the second communication, to indicate a first PHY parameter;

the second set of bits corresponds to a second subfield, specified by the second communication protocol, to indicate a second PHY parameter; and the first value and the second value corresponds to a combination of values of the first PHY parameter and the second PHY parameter not supported by the second communication protocol.

15. The apparatus of claim 9, wherein the second communication protocol conforms to the Institute for Electrical and Electronics Engineers (IEEE) 802.11ac Standard.

16. The apparatus of claim 15, wherein the first communication protocol is a communication protocol that supports a higher throughput than the IEEE 802.11ac Standard.

17. A method, comprising:

receiving, at a wireless network interface device, a physical layer (PHY) protocol data unit;

decoding, at the wireless network interface device, a field of a PHY preamble of the PHY protocol data unit, including decoding a received cyclic redundancy check (CRC) included in the field;

generating, at the wireless network interface device, a first CRC based on the field using a first CRC generation scheme, the first CRC generation scheme, specified by a first communication protocol, for a corresponding field in a PHY preamble format defined by the first communication protocol;

generating, at the wireless network interface device, a second CRC based on the field using a second CRC generation scheme, the second CRC generation scheme specified, specified by a second communication protocol, for a corresponding field in a PHY preamble format defined by the second communication protocol;

comparing, at the wireless network interface device, the received CRC to (i) the first generated CRC and (ii) the second generated CRC; and determining, at the wireless network interface device, whether the PHY protocol data unit conforms to the second communication protocol based on the comparison of the received CRC to (i) the first generated CRC and (ii) the second generated CRC.

18. The method of claim 17, wherein:

generating the first CRC comprises generating the first CRC according to a first CRC polynomial, the first CRC polynomial specified for the corresponding field in the PHY preamble format defined by the first communication protocol; and generating the second CRC comprises generating the second CRC according to a second CRC polynomial, the second CRC polynomial specified for the corresponding field in the PHY preamble format defined by the second communication protocol, wherein the second CRC polynomial is different than the first CRC polynomial.

19. The method of claim 17, wherein:

generating the first CRC comprises generating the first CRC according to a first CRC polynomial, the first CRC polynomial specified the corresponding field in the PHY preamble format defined by the first communication protocol; and generating the second CRC comprises:
  generating a plurality of CRC bits according to the first CRC polynomial, and
  encrypting one or more bits of the plurality of CRC bits to generate the second CRC.

20. The method of claim 17, wherein:

generating the first CRC comprises generating the first CRC according to a first CRC polynomial, the first CRC polynomial specified for the corresponding field in the PHY preamble format defined by the first communication protocol, and generating the second CRC comprises:
  generating a plurality of CRC bits according to the first CRC polynomial,
  selecting a subset of the plurality of CRC bits, the subset to be utilized for the second CRC; and
  encrypting one or more bits in the selected subset of the plurality of CRC bits to generate the second CRC.

21. An apparatus, comprising:

a wireless network interface having one or more integrated circuit (IC) devices configured to:
  receive a physical layer (PHY) protocol data,
  decode a field of a PHY preamble of the PHY protocol data unit, including decoding a received cyclic redundancy check (CRC) included in the field,
  generate, based on the field, a first CRC using a first CRC generation scheme, the first CRC generation scheme, specified by a first communication protocol, for a corresponding field in a PHY preamble format defined by the first communication protocol,
  generate, based on the field, a second CRC using a second CRC generation scheme, the second CRC generation scheme specified, specified by a second communication protocol, for a corresponding field in a PHY preamble format defined by the second communication protocol,
  compare the received CRC to (i) the first generated CRC and (ii) the second generated CRC, and
  determine whether the PHY protocol data unit conforms to the second communication protocol based on the comparison of the received CRC to (i) the first generated CRC and (ii) the second generated CRC.

22. The apparatus of claim 21, wherein the one or more IC devices are further configured to:

generate the first CRC according to a first CRC polynomial, the first CRC polynomial specified for the corresponding field in the PHY preamble format defined by the first communication protocol; and generate the second CRC according to a second CRC polynomial, the second CRC polynomial specified for the corresponding field in the PHY preamble format defined by the second communication protocol, wherein the second CRC polynomial is different than the first CRC polynomial.

23. The apparatus of claim 21, wherein the one or more IC devices are further configured to:

generate the first CRC according to a first CRC polynomial, the first CRC polynomial specified the corresponding field in the PHY preamble format defined by the first communication protocol; and generate the second CRC at least by:
  generating a plurality of CRC bits according to the first CRC polynomial, and
  encrypting one or more bits of the plurality of CRC bits to generate the second CRC.

24. The apparatus of claim 21, wherein the one or more IC devices are further configured to:

generate the first CRC according to a first CRC polynomial, the first CRC polynomial specified the corresponding field in the PHY preamble format defined by the first communication protocol, and generate the second CRC at least by:
  generating a plurality of CRC bits according to the first CRC polynomial,
  selecting a subset of the plurality of CRC bits, the subset to be utilized for the CRC for the second CRC; and
  encrypting one or more bits in the selected subset of the plurality of CRC bits to generate the second CRC.

* * * * *